(12) United States Patent
Berkovich

(10) Patent No.: US 10,598,936 B1
(45) Date of Patent: Mar. 24, 2020

(54) MULTI-MODE ACTIVE PIXEL SENSOR

(71) Applicant: Facebook Technologies, LLC, Menlo Park, CA (US)

(72) Inventor: Andrew Samuel Berkovich, Redmond, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 15/960,354

(22) Filed: Apr. 23, 2018

(51) Int. Cl.
| | |
|---|---|
| *G06F 17/16* | (2006.01) |
| *H04N 5/232* | (2006.01) |
| *H04N 5/351* | (2011.01) |
| *G02B 27/01* | (2006.01) |
| *G06F 3/01* | (2006.01) |
| *G06K 9/00* | (2006.01) |
| *H01L 27/146* | (2006.01) |
| *G06T 19/00* | (2011.01) |
| *H04N 5/355* | (2011.01) |
| *G02B 27/00* | (2006.01) |
| *H04N 5/235* | (2006.01) |

(52) U.S. Cl.
CPC ......... *G02B 27/0172* (2013.01); *G06F 3/012* (2013.01); *G06K 9/00671* (2013.01); *G06T 19/006* (2013.01); *H01L 27/14643* (2013.01); *G02B 27/0093* (2013.01); *G02B 2027/0178* (2013.01); *G06F 3/013* (2013.01); *G06F 17/16* (2013.01); *H04N 5/2351* (2013.01); *H04N 5/23245* (2013.01); *H04N 5/351* (2013.01); *H04N 5/35581* (2013.01)

(58) Field of Classification Search
CPC .......... G02B 27/0172; G02B 27/0093; G02B 2027/0138; G02B 2027/0178; G06F 3/012; G06F 3/013; G06F 17/16; G06K 9/00671; G06T 19/006; H01L 27/14643; H04N 5/23245; H04N 5/351; H04N 5/2351; H04N 5/3554; H04N 5/35581
See application file for complete search history.

(56) References Cited

U.S. PATENT DOCUMENTS

| | | | |
|---|---|---|---|
| 10,194,094 B2 * | 1/2019 | Yanagida | H04N 5/2354 |
| 10,334,188 B2 * | 6/2019 | Ando | H04N 5/332 |
| 2004/0124227 A1 * | 7/2004 | Seki | B23K 9/0953 228/103 |
| 2004/0161246 A1 * | 8/2004 | Matsushita | G06F 3/002 398/187 |

(Continued)

*Primary Examiner* — Michael J Eurice
(74) *Attorney, Agent, or Firm* — Kilpatrick Townsend & Stockton LLP

(57) ABSTRACT

Examples of an image sensor are disclosed. In one example, the image sensor comprises a dual-mode pixel cell operable in a first mode and in a second mode at different times, the pixel cell including a photodiode to receive incident light. The image sensor further comprises one or more configurable voltage sources coupled with the photodiode. In the first mode, the one or more voltage sources are configured to bias the photodiode to generate a quantity of charges that reflects a quantity of photons of the incident light received by the photodiode within a first exposure period. In the second mode, the one or more voltage sources are configured to bias the photodiode to generate a signal corresponding to a time when the photodiode receives a first photon of the incident light within a second exposure period for a time-of-flight measurement.

22 Claims, 17 Drawing Sheets

(56) References Cited

U.S. PATENT DOCUMENTS

| | | | |
|---|---|---|---|
| 2005/0046584 A1* | 3/2005 | Breed | B60C 11/24 340/13.31 |
| 2006/0266922 A1* | 11/2006 | McGrath | H01L 27/14609 250/208.1 |
| 2008/0030573 A1* | 2/2008 | Ritchey | H04N 7/18 348/36 |
| 2010/0020209 A1* | 1/2010 | Kim | H04N 3/155 348/294 |
| 2011/0096009 A1* | 4/2011 | Kurokawa | G06F 3/0412 345/173 |
| 2011/0122098 A1* | 5/2011 | Kurokawa | G06F 3/0412 345/175 |
| 2011/0187908 A1* | 8/2011 | Kawahito | H01L 27/14603 348/306 |
| 2012/0262365 A1* | 10/2012 | Mallinson | G01S 1/725 345/156 |
| 2012/0274744 A1* | 11/2012 | Wan | H04N 5/37452 348/46 |
| 2013/0026384 A1* | 1/2013 | Kim | G01S 17/89 250/393 |
| 2013/0027564 A1* | 1/2013 | Solhusvik | H04N 5/3698 348/187 |
| 2013/0062500 A1* | 3/2013 | Oh | G01S 17/89 250/201.1 |
| 2013/0127980 A1* | 5/2013 | Haddick | G06F 3/013 348/14.08 |
| 2013/0215231 A1* | 8/2013 | Hiramoto | G02B 27/0075 348/46 |
| 2013/0222681 A1* | 8/2013 | Wan | H04N 5/272 348/371 |
| 2013/0278631 A1* | 10/2013 | Border | G02B 27/017 345/633 |
| 2014/0092287 A1* | 4/2014 | Jin | H04N 5/3745 348/301 |
| 2014/0104397 A1* | 4/2014 | Shin | H04N 5/332 348/49 |
| 2014/0267613 A1* | 9/2014 | Cohen | G01S 7/4863 348/46 |
| 2014/0284454 A1* | 9/2014 | Krymski | H01L 27/14607 250/208.1 |
| 2015/0187923 A1* | 7/2015 | Kawahito | H01L 27/14825 257/223 |
| 2015/0220143 A1* | 8/2015 | Choi | G06F 3/011 345/156 |
| 2016/0050383 A1* | 2/2016 | Grauer | H04N 5/353 250/208.1 |
| 2016/0073088 A1* | 3/2016 | Cohen | H01L 27/14627 348/46 |
| 2016/0119555 A1* | 4/2016 | Saylor | G06K 9/00604 348/78 |
| 2016/0139411 A1* | 5/2016 | Kang | G02B 27/0172 359/630 |
| 2016/0150165 A1* | 5/2016 | Grauer | H01L 27/14621 348/280 |
| 2016/0182847 A1* | 6/2016 | Wan | H04N 5/3765 348/302 |
| 2016/0198141 A1* | 7/2016 | Fettig | H04N 13/218 348/46 |
| 2016/0235323 A1* | 8/2016 | Tadi | A61B 5/7285 |
| 2016/0307326 A1* | 10/2016 | Wang | G01B 11/22 |
| 2016/0344965 A1* | 11/2016 | Grauer | H04N 5/353 |
| 2016/0373652 A1* | 12/2016 | Ando | H04N 5/332 |
| 2017/0026590 A1* | 1/2017 | Wang | H04N 5/2256 |
| 2017/0142353 A1* | 5/2017 | Tadmor | H04N 5/23245 |
| 2017/0273161 A1* | 9/2017 | Nakamura | H05B 37/0227 |
| 2017/0366726 A1* | 12/2017 | Yanagida | H04N 5/2354 |
| 2018/0091750 A1* | 3/2018 | Gutierrez | H01L 27/146 |
| 2018/0103222 A1* | 4/2018 | Yan | H01L 27/14614 |
| 2018/0109750 A1* | 4/2018 | Sukegawa | H01L 27/14 |
| 2018/0143430 A1* | 5/2018 | Koppal | G02B 27/01 |
| 2018/0211990 A1* | 7/2018 | Yorikado | G02B 3/00 |
| 2018/0239430 A1* | 8/2018 | Tadi | G02B 27/0172 |
| 2018/0267663 A1* | 9/2018 | Cho | G06F 3/0416 |
| 2018/0275255 A1* | 9/2018 | Yates | G01S 17/89 |
| 2018/0288343 A1* | 10/2018 | McCarten | H04N 5/35581 |
| 2018/0338127 A1* | 11/2018 | Wang | H04N 5/3696 |
| 2019/0020864 A1* | 1/2019 | Wang | H04N 5/3696 |
| 2019/0028660 A1* | 1/2019 | Ando | H04N 5/332 |
| 2019/0082128 A1* | 3/2019 | Oh | G01S 17/89 |
| 2019/0179409 A1* | 6/2019 | Jones | G06F 3/013 |
| 2019/0181171 A1* | 6/2019 | Tadmor | H01L 27/14605 |
| 2019/0188914 A1* | 6/2019 | Ogasawara | G06T 19/006 |

* cited by examiner

MULTI-MODE ACTIVE PIXEL SENSOR

BACKGROUND

The disclosure relates generally to image sensors, and more specifically to pixel cell sensor that can be operated in multiple measurement modes.

A typical image sensor includes a photodiode to sense incident light by converting photons into charges (e.g., electrons or holes). The image sensor further include a capacitor (e.g., a floating drain node of a transistor) to collect the charges generated by the photodiode during an exposure period. The collected charges can develop a voltage at the capacitor. An image of a scene can be derived from the voltages developed at the capacitors of an array of image sensors.

SUMMARY

The present disclosure relates to image sensors. More specifically, and without limitation, this disclosure relates to a pixel cell including a photodiode. This disclosure also relates to operating the circuitries of a pixel cell to perform at least two different modes of measurement at different times. In a first mode of measurement, an intensity of incident light is measured based on the photodiode current for two-dimensional (2D) imaging. In a second mode of measurement, a time-of-flight measurement is performed based on the photodiode current for three-dimensional (3D) imaging.

In one example, an apparatus is provided. The apparatus comprises a dual-mode pixel cell operable in a first mode and in a second mode at different times, the pixel cell including a photodiode to receive incident light. The apparatus further comprises one or more configurable voltage sources coupled with the photodiode. In the first mode, the one or more voltage sources are configured to bias the photodiode to generate a quantity of charges that reflects a quantity of photons of the incident light received by the photodiode within a first exposure period. In the second mode, the one or more voltage sources are configured to bias the photodiode to generate a signal corresponding to a time when the photodiode receives a first photon of the incident light within a second exposure period for a time-of-flight measurement.

In some aspects, in the first mode, the one or more voltage sources are configured to bias the photodiode to generate a current of which a magnitude is proportional to an intensity of the incident light.

In some aspects, in the second mode, the one or more voltage sources are configured to bias the photodiode to generate an avalanche current upon receiving the first photon of the incident light.

In some aspects, the apparatus further comprises a controller coupled with the pixel cell. The controller is configured to: operate the pixel cell in the first mode at a first time to generate first data representing an intensity of light reflected by an object; and operate the pixel cell in the second mode at a second time to generate second data representing a distance between the apparatus and the object.

In some aspects, the apparatus further comprises an illuminator. The controller is configured to control the illuminator to project a pulse of photons including the first photon in the second mode and to disable the illuminator in the first mode. In the second mode, the pixel cell is also operated to receive the first photon reflected by the object.

In some aspects, the controller is further configured to: determine a third time when the illuminator projects the pulse of photons; determine a fourth time when the first photon reflected by the object is received by the photodiode; and determine a difference between the third time and the fourth time for the time-of-flight measurement.

In some aspects, the controller is configured to: determine a timing window for detecting the first photon based on the third time; and determine a first photon received by the photodiode within the timing window as the first photon reflected by the object.

In some aspects, the controller is configured to control the illuminator to project a first train of pulses of photons in the second mode; the photodiode is configured to generate a second train of pulses of signals based on detecting one or more photons of the first train of pulses reflected by the object; and the controller is configured to determine a phase difference between the first train of pulses and the second train of pulses for the time-of-flight measurement.

In some aspects, the one or more configurable voltage sources are configured to: in the first mode, bias a cathode of the photodiode at a first voltage and bias an anode of the photodiode at a second voltage; and in the second mode, bias the cathode of the photodiode at a third voltage and bias the anode of the photodiode at a fourth voltage. A first difference between the first voltage and the second voltage is smaller than a second difference between the third voltage and the fourth voltage. The second difference is larger than a breakdown voltage of the photodiode.

In some aspects, the third voltage is higher than the first voltage.

In some aspects, the fourth voltage is lower than the second voltage.

In some aspects, the fourth voltage is a negative voltage.

In some aspects, the one or more voltage sources comprises a first voltage source configured to generate the second voltage in the first mode and the fourth voltage in the second mode to bias the anode of the photodiode. The first voltage source is external to the pixel cell.

In some aspects, the apparatus further comprises a capacitor configured to store charges generated by the photodiode, and a reset switch configured to: before the first exposure period, set a voltage at the capacitor based on a first bias voltage supplied by the one or more voltage sources, and before the second exposure period, set the voltage at the capacitor based on a second bias voltage supplied by the one or more voltage sources. The apparatus further comprises a transfer gate configured to electrically couple the capacitor to a cathode of the photodiode during the first exposure period and during the second exposure period, such that the cathode of the photodiode is biased at the first bias voltage when the first mode begins, and the cathode of the photodiode is biased at the second bias voltage the second mode begins.

In some aspects, the apparatus further comprises an analog-to-digital converter (ADC) configured to generate a first digital representation of the quantity of charges generated in the first exposure period, and a time-to-digital converter (TDC) configured to generate a second digital representation of the time-of-flight measurement. The photodiode is implemented in a first semiconductor layer, whereas at least one of the ADC or the TDC is implemented in a second semiconductor layer. The first semiconductor layer and the second semiconductor layer forms a stack structure.

In some aspects, the apparatus further comprises a plurality of pixel cells, each of the plurality of pixel cells being operable in the first mode or in the second mode. The apparatus further comprises a time-to-digital converter configured to generate a digital representation of a time-of-flight measurement for a pre-determined subset of the plurality of pixel cells being operated in the second mode.

In some aspects, the controller is configured to: determine a number of pixel cells of which the photodiode generates the signal; and responsive to determining that the number of pixel cells exceeds a threshold, control the time-to-digital converter to generate the digital representation of the time-of-flight measurement.

In some aspects, the pre-determined subset of the plurality of pixel cells corresponds to a region-of-interest determined from an image frame. The image frame is generated based on output data of the plurality of pixel cells being operated in the first mode.

In some examples, a method is provided. The method comprises: at a first exposure period, controlling one or more voltage sources to bias a photodiode of a pixel cell to generate a quantity of charges that reflects an intensity of incident light received by the photodiode within the first exposure period; and at a second exposure period, controlling the one or more voltage sources to bias the photodiode of the pixel cell to generate a signal corresponding to a time when the photodiode receives a first photon of the incident light within the second exposure period.

In some examples, at the second exposure period, the photodiode is biased to generate an avalanche current upon receiving the first photon of the incident light.

BRIEF DESCRIPTION OF THE DRAWINGS

Illustrative embodiments are described with reference to the following figures.

Figure 1A:
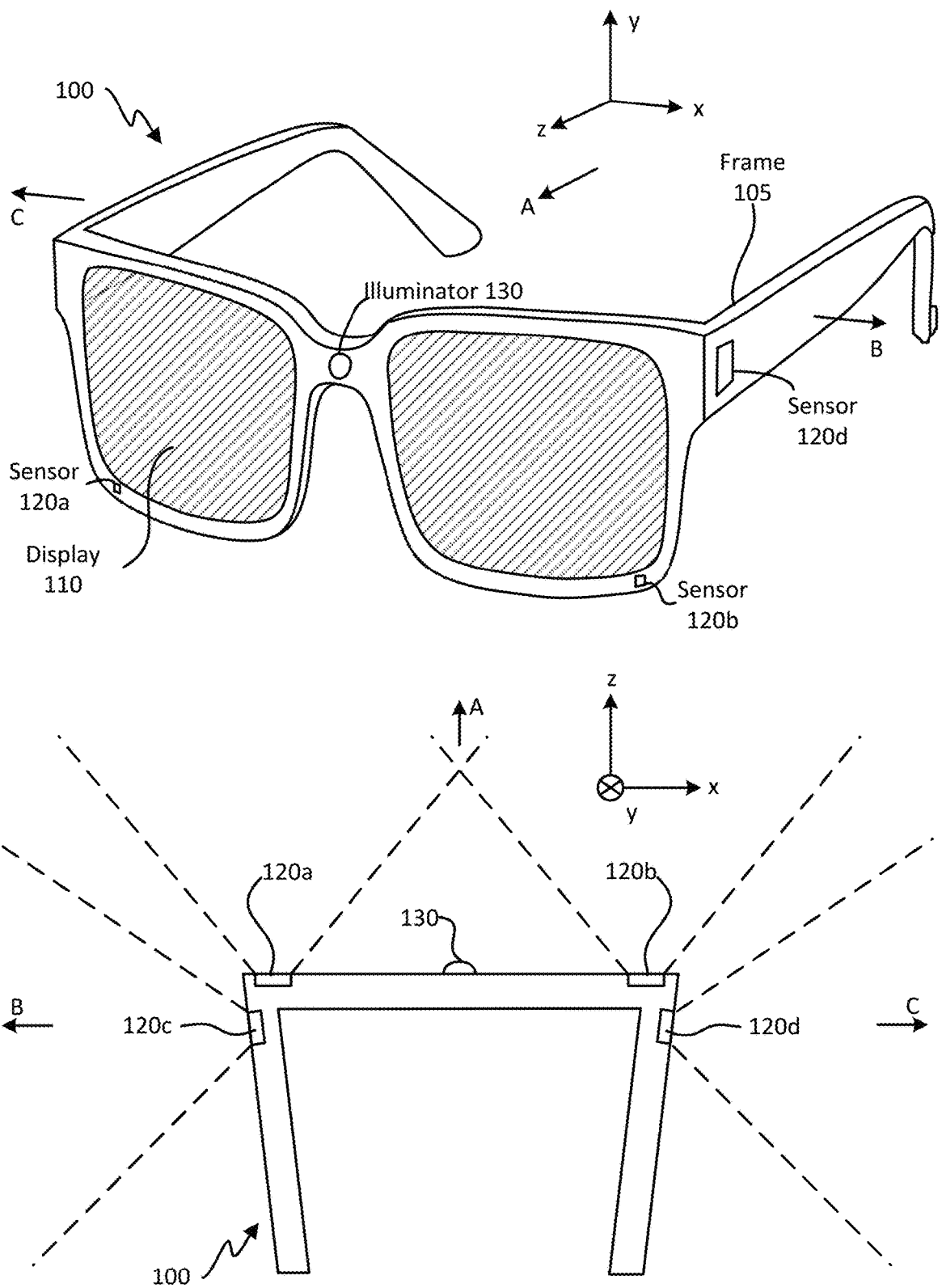
FIGS. 1A and 1B are diagrams of an embodiment of a near-eye display.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A typical image sensor includes a pixel cell with a photodiode to sense incident light by converting photons into charges (e.g., electrons or holes). The image sensor further includes a floating drain node (or other charge storage devices) configured as a capacitor to accumulate the charges generated by the photodiode during an exposure period. The accumulated charges can develop a voltage at the capacitor, and a pixel value can be generated based on the voltage. An image comprising an array of pixels can be derived from the digital outputs of the voltages output by an array of pixel cells.

A pixel cell can be used to perform different modes of imaging, such as 2D and 3D sensing. To perform 2D sensing, a pixel cell can generate a pixel value representing the intensity of light incident upon the pixel cell. For example, a photodiode at a pixel cell can generate charges at a rate that is proportional to an intensity of light incident upon the pixel cell, and the quantity of charges accumulated in an exposure period can be used to represent the intensity of light. The quantity of charges can be represented by the voltage developed at the capacitor that accumulates the charges. The voltage can be sampled and quantized by an analog-to-digital converter (ADC) to generate the pixel value. On the other hand, to perform 3D sensing, a pixel cell can generate a pixel value representing a distance between the pixel cell and an object. The distance can be determined based on time-of-flight measurement. For example, an illuminator may project light onto the object, and the photodiode of the pixel cell can generate charges upon receiving the reflected light. The accumulation of the charges at the capacitor can lead to a change in the voltage developed at the capacitor. Assuming that the illuminator is very close to the pixel cell, the duration of a time period between when the illuminator projects the light and when the reflected light is received by the photodiode (which can be indicated by the change in the voltage at the capacitor) can be determined by a time-to-digital converter (TDC). The duration can be digitized to generate the pixel value.

A pixel cell array can be used to generate an image of a scene. In some examples, a subset of the pixel cells within the array can be used to perform 2D sensing of the scene, and another subset of the pixel cells within the array can be used to perform 3D sensing of the scene. The fusion of 2D and 3D imaging data are useful for many applications that provide virtual-reality (VR), augmented-reality (AR) and/or mixed reality (MR) experiences. For example, a wearable VR/AR/MR system may perform scene reconstruction of an environment in which the user of the system is located. Based on the reconstructed scene, the VR/AR/MR can generate display effects to provide interactive experience. To reconstruct a scene, a subset of pixel cells within a pixel cell array can perform 3D sensing to, for example, identify a set of physical objects in the environment and determine the distances between the physical objects and the user. Another subset of pixel cells within the pixel cell array can perform 2D sensing to, for example, capture visual attributes including textures, colors, and reflectivity of these physical objects. The 2D and 3D image data of the scene can then be merged to create, for example, a 3D model of the scene including the visual attributes of the objects. As another example, a wearable VR/AR/MR system can also perform a head tracking operation based on a fusion of 2D and 3D image data. For example, based on the 2D image data, the VR/AR/AR system can extract certain image features to identify an object. Based on the 3D image data, the VR/AR/AR system can track a location of the identified object relative to the wearable device worn by the user. The VR/AR/AR system can track the head movement based on, for example, tracking the change in the location of the identified object relative to the wearable device as the user's head moves.

Although a pixel cell array can perform 2D and 3D imaging of a scene by having different pixel cells to perform 2D sensing and 3D sensing, such arrangements can pose a number of challenges. First, because only a subset of the pixel cells of the array is used to perform either 2D imaging or 3D imaging, the spatial resolutions of both of the 2D image and 3D image are lower than the maximum spatial resolution available at the pixel cell array. Although the resolutions can be improved by including more pixel cells, such an approach can lead to increases in the form-factor of the image sensor as well as power consumption, both of which are undesirable especially for a wearable device. Moreover, because the 2D imaging pixel cells and the 3D imaging pixel cells are not collocated, the 2D image and the 3D image may capture information of different spots of a scene. For example, a pixel in the 2D image of a scene may not have a corresponding pixel in the 3D image of the same scene because these pixels are represented by different pixel cells. Therefore, the 2D information and the 3D information for each pixel cannot be obtained by simply merging the 2D and 3D images. The lack of correspondence between the 2D image and the 3D image can be worsened when the pixel cell array is capturing 2D and 3D images of a moving object. While there are processing techniques available to correlate pixels of the 2D and 3D images (e.g., interpolation), these techniques are typically computation-intensive and can also increase power consumption.

This disclosure relates to a dual-mode pixel cell operable in a first measurement mode and in a second measurement mode at different times. The pixel cell includes a photodiode to receive incident light, and one or more configurable voltage sources coupled with the photodiode. In the first measurement mode, the one or more voltage sources can be configured to bias the photodiode to generate a quantity of charges that reflects a quantity of photons of the incident light received by the photodiode within a first exposure period. In the second measurement mode, the one or more voltage sources can be configured to bias the photodiode to generate a signal corresponding to a time when the photodiode receives a first photon of the incident light within a second exposure period for a time-of-flight measurement.

With embodiments of the present disclosure, the same pixel cell can be operated in the first measurement mode (e.g., to perform 2D sensing) and in the second measurement mode (e.g., to perform 3D sensing) at different times. As a result, the same set of pixel cells in a pixel cell array can generate a 2D image and a 3D image, which improves the correspondence between the two images. Moreover, given that every pixel cell is used to generate the 2D or 3D image, the full spatial resolution of the pixel cell array can be utilized. As a result, the spatial resolutions of the images can be improved, while the form factor and power consumption of the image sensor can be reduced.

Embodiments of the disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an embodiment of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel cell array comprising an array of pixel cells and configured to generate image data representing different fields of views along different directions. For example, sensors 120a and 120b may be configured to provide image data representing two field of views towards a direction A along the Z axis, whereas sensor 120c may be configured to provide image data representing a field of view towards a direction B along the X axis, and sensor 120d may be configured to provide image data representing a field of view towards a direction C along the X axis.

In some embodiments, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such arrangement, the accuracy and robustness of tracking a location of the user within the physical environment can be improved.

In some embodiments, near-eye display 100 may further include one or more active illuminator 130 to project light into the physical environment. The light projected can be associated with different frequency spectrums (e.g., visible light, infra-red light, ultra-violet light, etc.), and can serve various purposes. For example, illuminator 130 may project light and/or light patterns in a dark environment (or in an environment with low intensity of infra-red light, ultra-violet light, etc.) to assist sensors 120a-120d in capturing 3D images of different objects within the dark environments. The 3D images may include, for example, pixel data representing the distances between the objects and near-eye display 100. The distance information can be used to, for example, construct a 3D model of the scene, to track a head movement of the user, to track a location of the user, etc. As to be discussed in more details below, sensors 120a-120d can be operated in a first mode for 2D sensing and in a second mode for 3D sensing at different times. The 2D and 3D image data can be merged and provided to a system to provide a more robust tracking of, for example, the location of the user, the head movement of the user, etc.

Figure 1B:
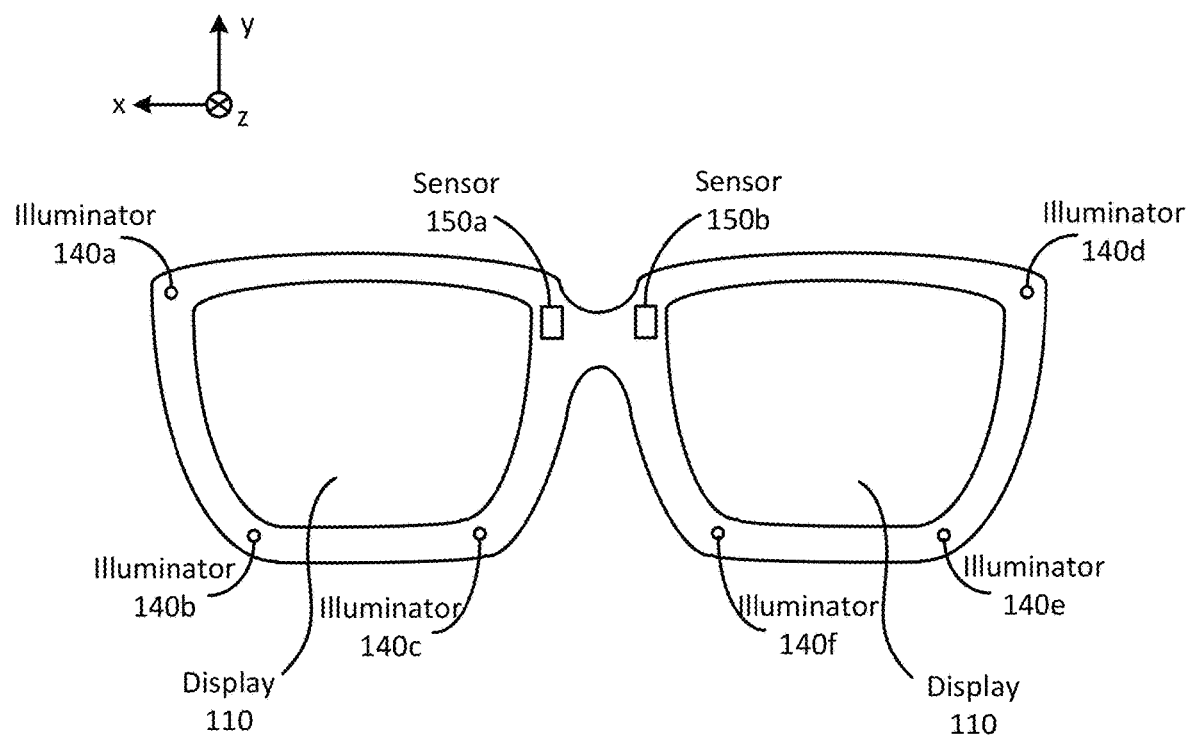

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain frequency range (e.g., NIR) towards direction D (which is opposite to direction A of FIG. 1A). The emitted light may be associated with a certain pattern, and can be reflected by the left eyeball of the user. Sensor 150a may include a pixel cell array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel cell array to generate an image of the reflected pattern. Based on the images of the reflected pattern from sensors 150a and 150b, the system can determine a gaze point of the user, and update the image data provided to display 100 based on the determined gaze point to provide an interactive experience to the user. In some examples, image sensors 150a and 150b may include same pixel cells as sensors 120a-120d.

Figure 1B:
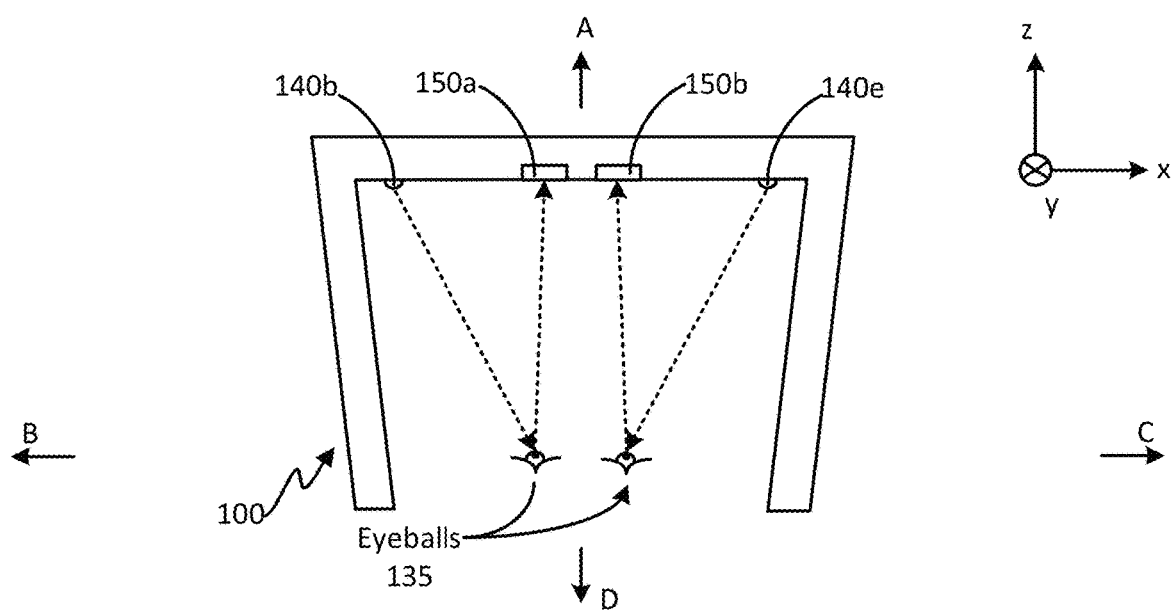
Figure 2:
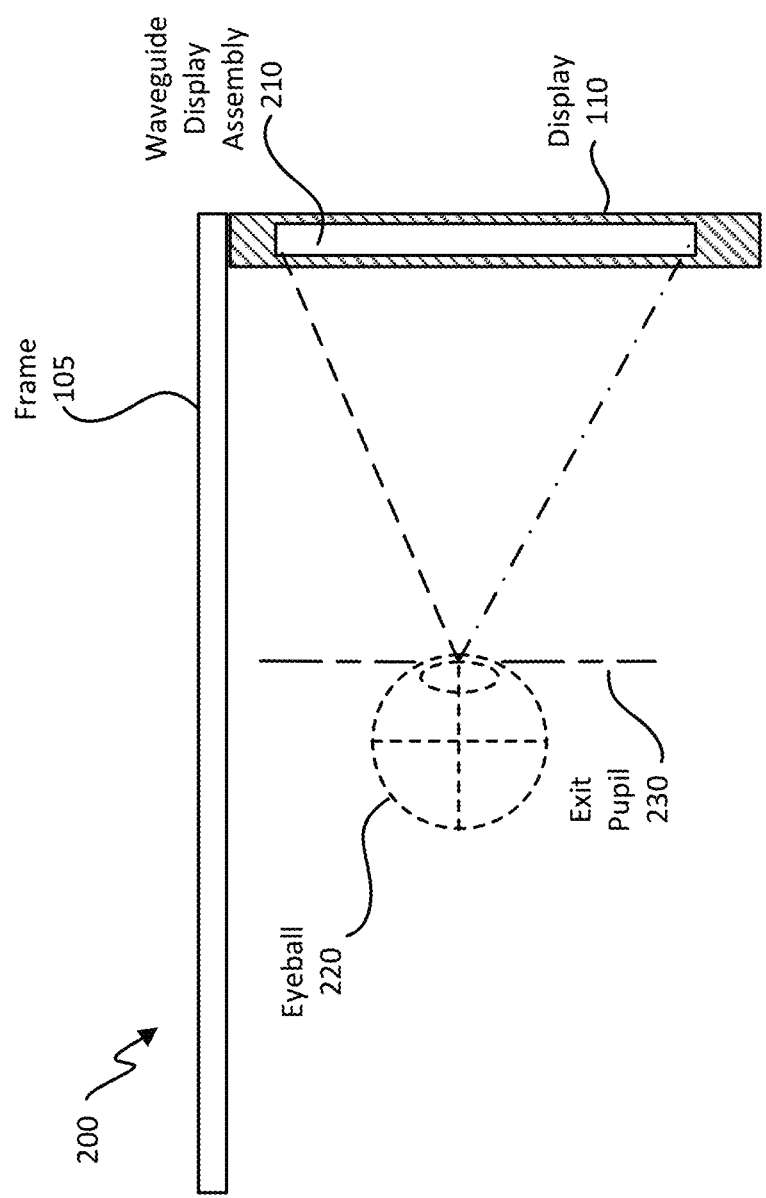
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
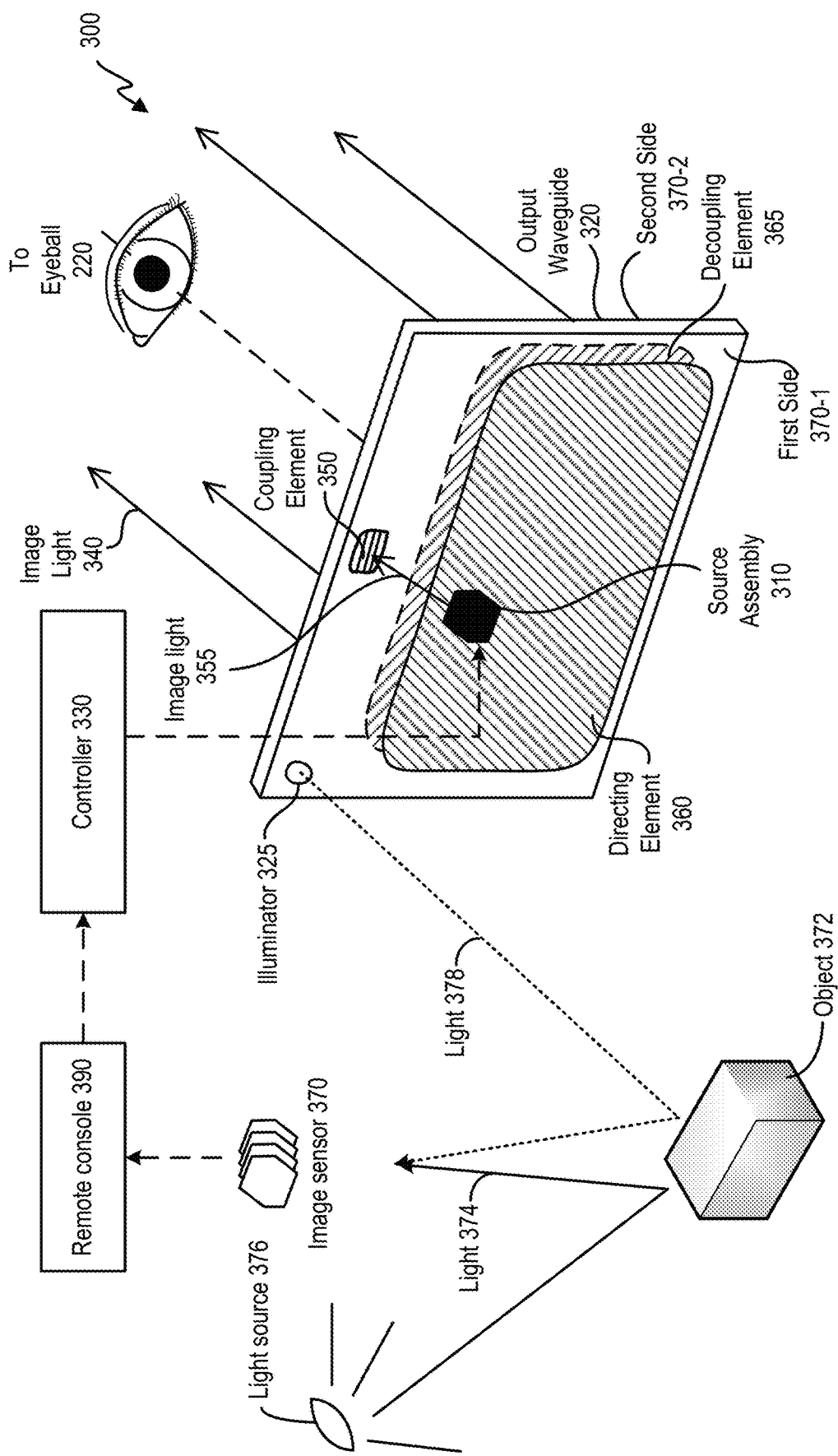
FIG. 3 illustrates an isometric view of an embodiment of a waveguide display.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, an illuminator 325, and a controller 330. Illuminator 325 can include illuminator 130 of FIG. 1A. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365.

Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A. Image sensors 120a-120d can be operated to perform 2D sensing and 3D sensing of, for example, an object 372 in front of the user (e.g., facing first side 370-1). For 2D sensing, each pixel cell of image sensors 120a-120d can be operated to generate pixel data representing an intensity of light 374 generated by a light source 376 and reflected off object 372. For 3D sensing, each pixel cell of image sensors 120a-120d can be operated to generate pixel data representing a time-of-flight measurement for light 378 generated by illuminator 325. For example, each pixel cell of image sensors 120a-120d can determine a first time when illuminator 325 is enabled to project light 378 and a second time when the pixel cell detects light 378 reflected off object 372. The difference between the first time and the second time can indicate the time-of-flight of light 378 between image sensors 120a-120d and object 372, and the time-of-flight information can be used to determine a distance between image sensors 120a-120d and object 372. Image sensors 120a-120d can be operated to perform 2D and 3D sensing at different times, and provide the 2D and 3D image data to a remote console 390 that may be (or may be not) located within waveguide display 300. The remote console may combine the 2D and 3D images to, for example, generate a 3D model of the environment in which the user is located, to track a location and/or orientation of the user, etc. The remote console may determine the content of the images to be displayed to the user based on the information derived from the 2D and 3D images. The remote console can transmit instructions to controller 330 related to the determined content. Based on the instructions, controller 330 can control the generation and outputting of image light 355 by source assembly 310, to provide an interactive experience to the user.

Figure 4:
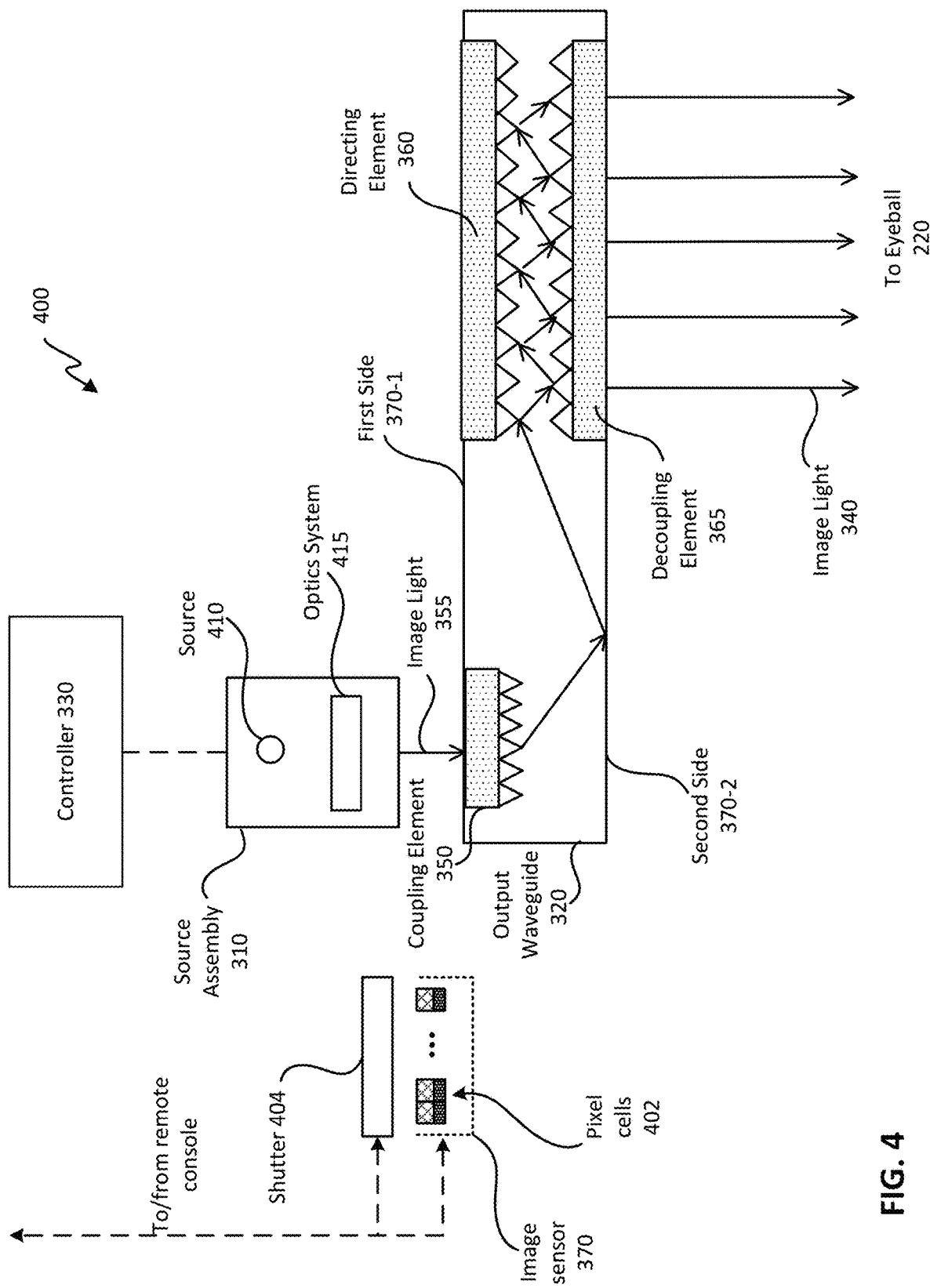
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate an image of the physical environment in front of the user. In some embodiments, there can be a mechanical shutter 404 interposed between the set of pixel cells 402 and the physical environment to control the exposure of the set of pixel cells 402. In some embodiments, the mechanical shutter 404 can be replaced by an electronic shutter gate, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident light samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
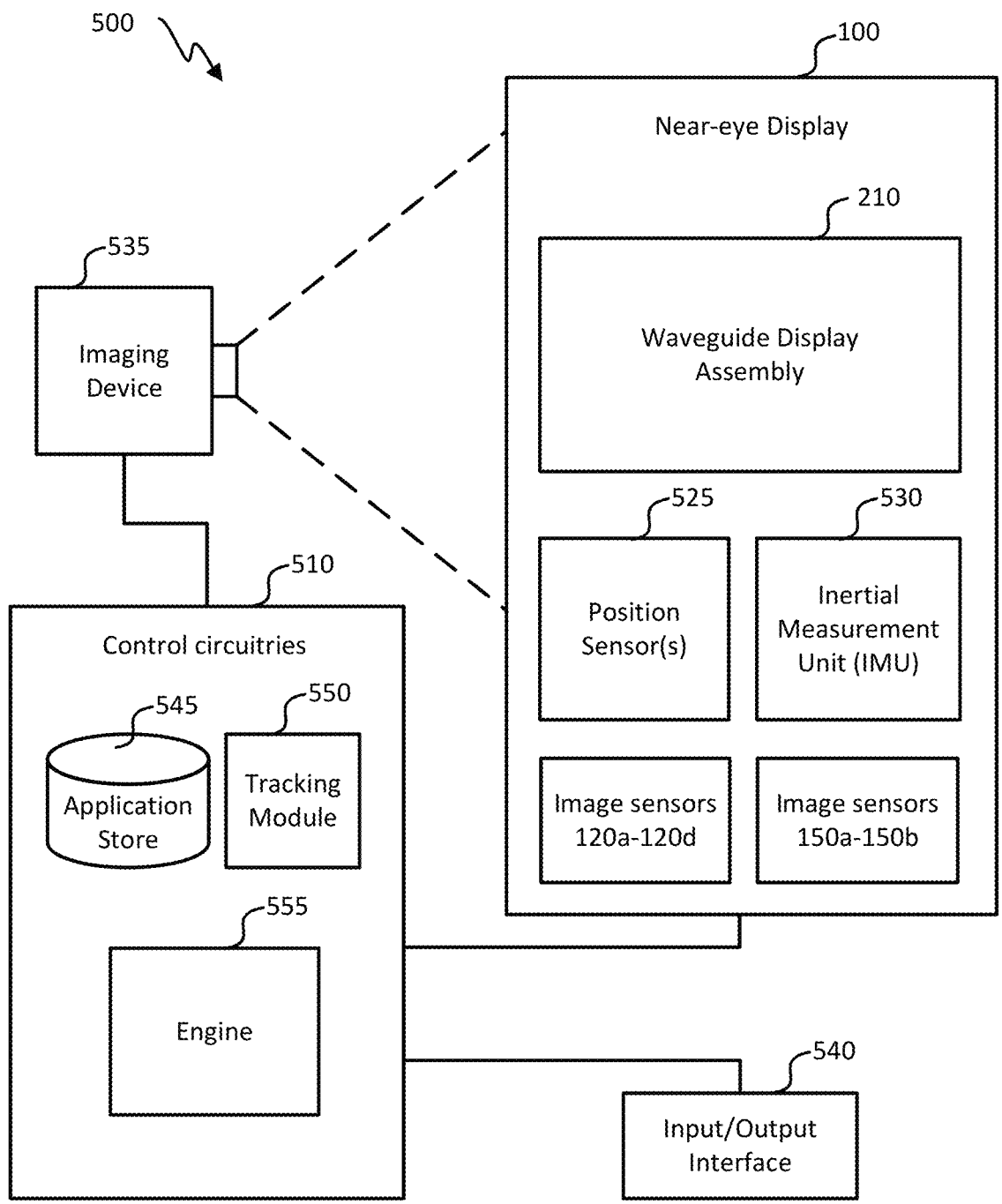
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to control circuitries 510. System 500 can be configured as a head-mounted device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound, etc.).

Near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of near-eye display 100 relative to an initial position of near-eye display 100 based on measurement signals received from one or more of position sensors 525.

Imaging device 535 may generate image data for various applications. For example, imaging device 535 may generate image data to provide slow calibration data in accordance with calibration parameters received from control circuitries 510. Imaging device 535 may include, for example, image sensors 120a-120d of FIG. 1A for generating 2D image data and 3D image data of a physical environment in which the user is located to track the location and head movement of the user. Imaging device 535 may further include, for example, image sensors 150a-150b of FIG. 1B for generating image data (e.g., 2D image data) for determining a gaze point of the user, to identify an object of interest of the user.

The input/output interface 540 is a device that allows a user to send action requests to the control circuitries 510. An action request is a request to perform a particular action. For example, an action request may be to start or end an application or to perform a particular action within the application.

Control circuitries 510 provides media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

The application store 545 stores one or more applications for execution by the control circuitries 510. An application is a group of instructions, that, when executed by a processor, generates content for presentation to the user. Examples of applications include: gaming applications, conferencing applications, video playback application, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), a gaze point of the user (e.g., based on image data provided by imaging device 535), a distance between an object and user (e.g., based on image data provided by imaging device 535).

Figure 6A:
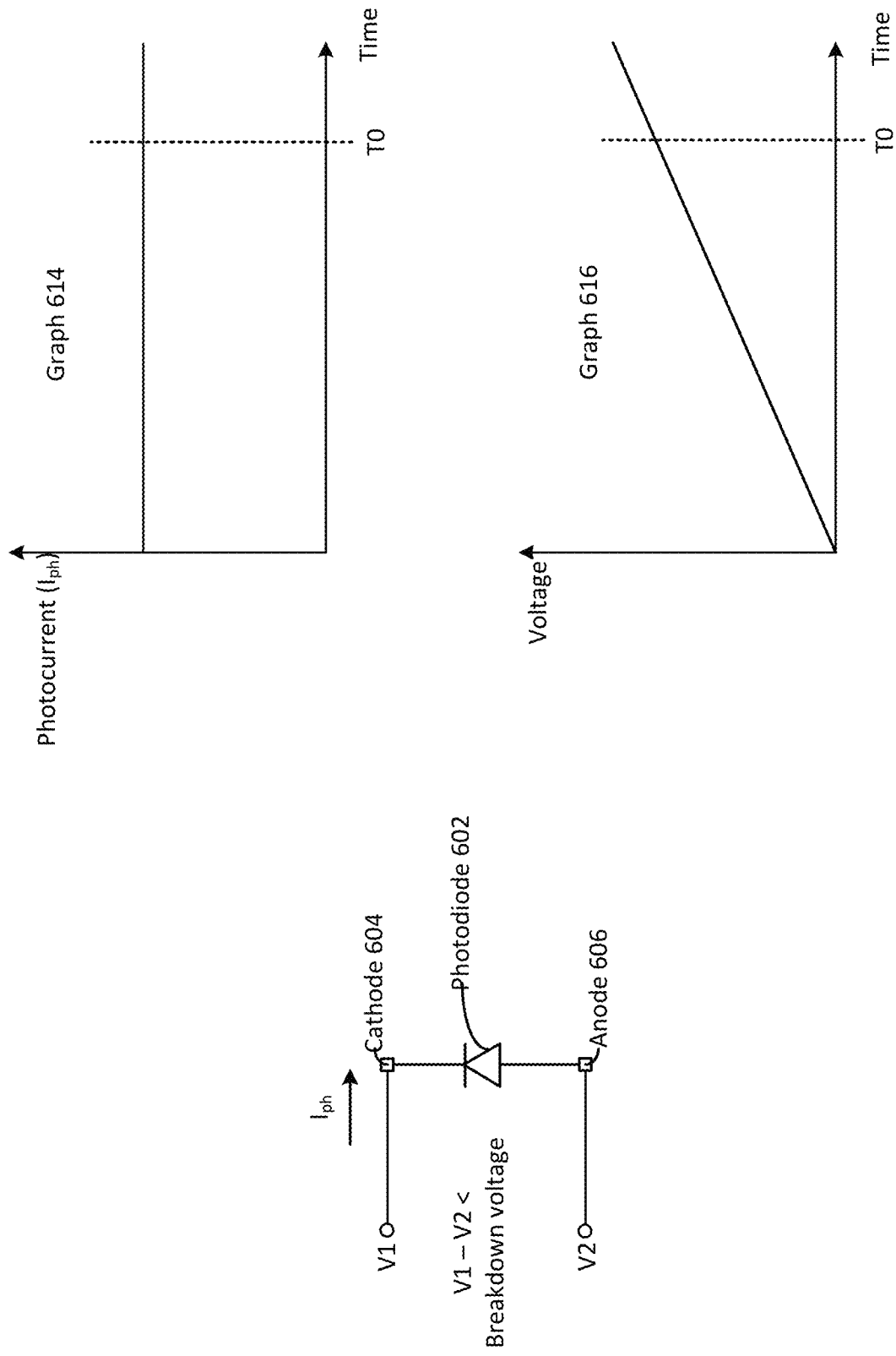
FIG. 6A and FIG. 6B illustrate operations of a photodiode for 2D and 3D imaging.

FIG. 6A illustrates an example configuration of a photodiode for 2D image sensing. Cathode 604 and anode 606 of photodiode 602 can receive, respectively, voltages V1 and V2. In the example of FIG. 6A, photodiode 602 can be operated in a reverse bias mode, where V1 is higher than V2, and the difference between V1 and V2 is lower than the breakdown voltage of photodiode 602. With this configuration, each photon (of the incident light) received by photodiode 602 can trigger the photodiode to generate an electron-hole pair. The holes and electrons can be swept across photodiode 602 towards, respectively, the anode and the cathode, to form a photocurrent $I_p h$. The photocurrent can be directly proportional to the number of electron-hole pairs generated by the photons which, in turn, can be directly proportional to the number of photons received by photodiode 602. Given that the number of photons received by photodiode 602 can be directly proportional to the incident light intensity, photodiode 602 can be operated to measure the incident light intensity within an exposure period T0. Referring to graph 614 on the right, if the exposure period T0 is very short, the incident light intensity, as well as the photocurrent generated by photodiode 602 in response to the incident light, can be approximately constant within short exposure time. The charges of the photocurrent can be accumulated at a capacitor, which can develop a voltage that rises linearly with respect to time, as shown in graph 616. The voltage can be sampled and quantized at the end of exposure period T0 to provide a measurement of the incident light intensity for 2D imaging.

Figure 6B:
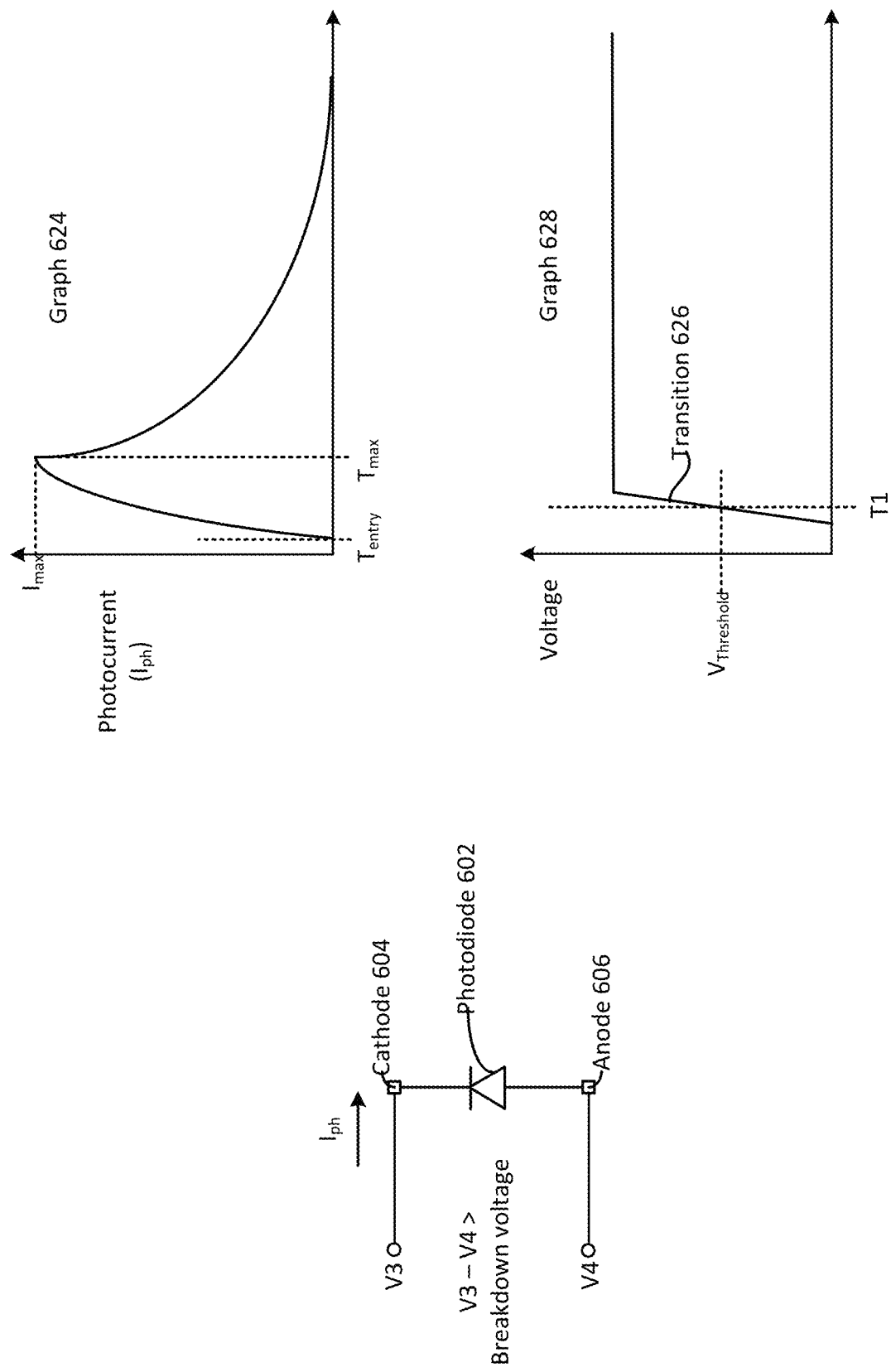

FIG. 6B illustrates another example configuration of a photodiode for 3D imaging. Cathode 604 and anode 606 of photodiode 602 can receive, respectively, voltages V3 and V4. In the example of FIG. 6B, photodiode 602 can be configured as an avalanche photodiode (e.g., to operate in the Gieger mode), with V3 higher than V4 and the difference between V3 and V4 being higher than or equal to the breakdown voltage of photodiode 602. With this configuration, when a photon enters photodiode 602 and triggers the photodiode to generate an electron-hole pair, the electron or the hole can trigger an avalanche breakdown in the diode due to the huge electric field created by the voltage difference between the cathode and the anode. The avalanche breakdown can lead to generation of a huge and rapidly-rising avalanche photocurrent. Referring to graph 624 on the right, the photon may enter photodiode 602 at the time ti, which triggers an avalanche breakdown. The avalanche breakdown can generate a rapidly increasing avalanche photocurrent before time $t_{max}$. The rapidly rising photocurrent leads to rapid accumulation of charges at the capacitor and causes a sharp transition 626 of the voltage developed at the capacitor, as shown in graph 628. The sharp transition can be detected based on, for example, the voltage crossing a voltage threshold $V_{threshold}$ at time T1. Time T1 in graph 628 can be used to approximate or estimate the time when the photon enters photodiode 602 (e.g., time $T_{entry}$ of graph 624). If the time when the photon leaves the illuminator is also known, a time-of-flight of the photon between the time when the photon leaves the illuminator and the time when the photon enter photodiode 602 (after being reflected by an object) can be determined. On the other hand, in a process of passive quenching, the flowing photocurrent introduces an IR drop at cathode 604, which reduces the voltage difference between V3 and V4. After the photocurrent reaches the maximum current Imax, the voltage difference may become lower than the breakdown voltage. The avalanche breakdown may stop and the photocurrent may reduce after the time $T_{max}$.

Figure 7A:
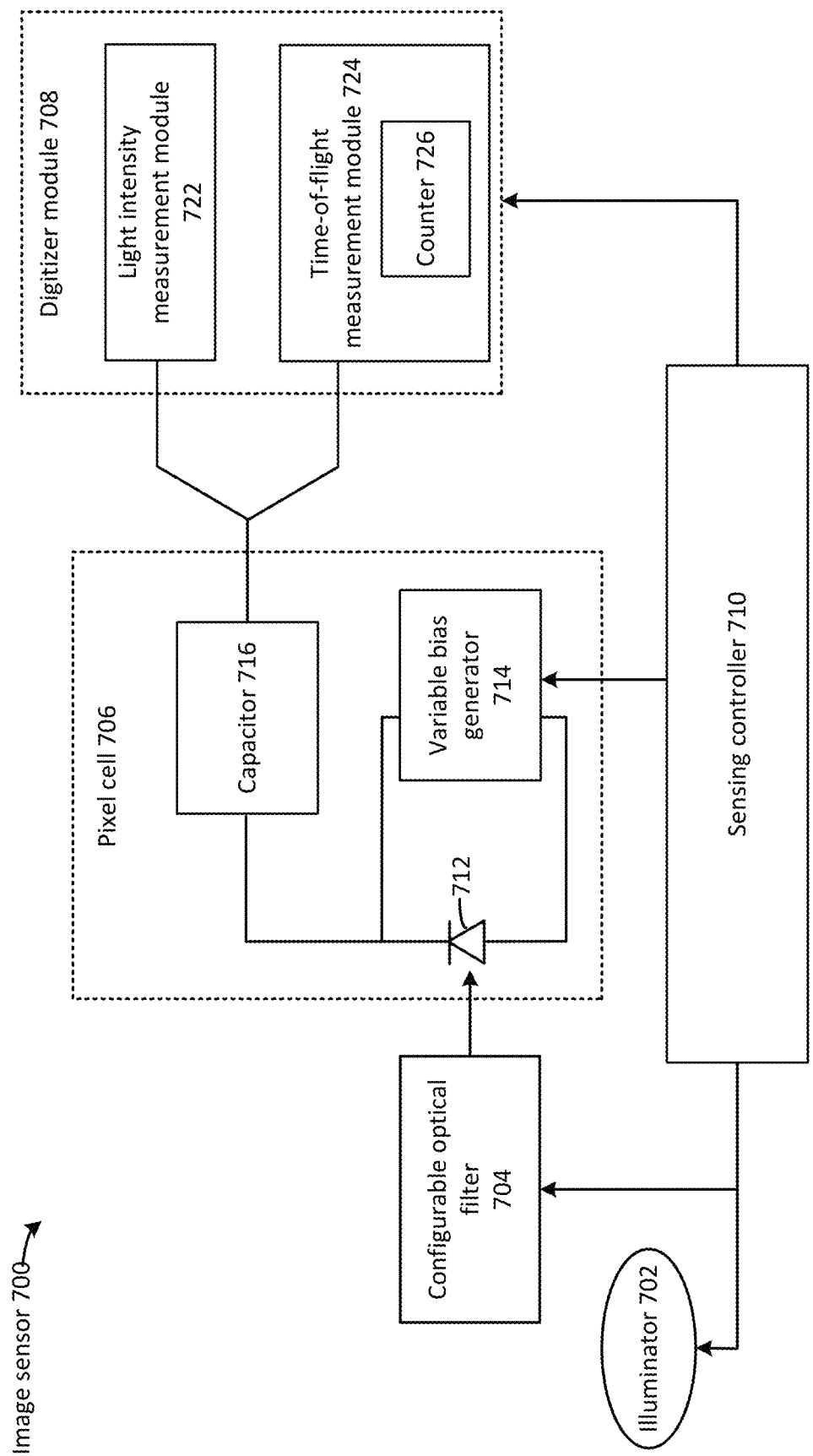
FIGS. 7A, 7B, 7C, and 7D illustrate examples of an image sensor and its operations for performing 2D and 3D imaging.

FIG. 7A illustrates an example of a dual-mode image sensor 700 that uses the same pixel cell and photodiode for both 2D sensing and 3D sensing. Image sensor 700 can be part of near-eye display 100, and can provide 2D and 3D image data to control circuitries 510 of FIG. 5 to control the display content of near-eye display 100. In the example of FIG. 7A, image sensor 700 may include an illuminator 702, a configurable optical filter 704, a pixel cell array including a pixel cell 706, and a digitizer module 708. Illuminator 702 may be an infra-red illuminator that can generate light pulses and can include, for example, a laser, a light emitting diode (LED), etc. Configurable optical filter 704 may include, for example, electrochromic devices, movable optical filters, etc., that can be controlled to transmit a certain frequency band of light (e.g., visible light or infra-red light) to pixel cell 706. Pixel cell 706 may include a photodiode 712 to receive light through configurable optical filter 704, a variable bias generator 714 to operate photodiode 712 either in the reverse bias mode or in the avalanche breakdown mode, and a capacitor 716 to convert the photocurrent generated by photodiode 712 to a voltage. Digitizer module 708 may include a light intensity measurement module 722 and a time-of-flight measurement module 724 to generate a pixel value based on the voltage at capacitor 716. In some examples, at least one of configurable optical filter 704 or digitizer module 708 can be part of pixel cell 706.

Image sensor 700 further includes a sensing controller 710 to control different components of image sensor 700 to perform 2D and 3D imaging. For example, for 2D imaging, sensing controller 710 can disable illuminator 702 and control configurable optical filter 704 to transmit a certain band of visible light (e.g., red, green, or blue colors) to pixel cell 706. Sensing controller 710 can also control variable bias generator 714 to operate photodiode 712 in the reverse bias mode (e.g., by applying a voltage across photodiode 712 that is below the breakdown voltage of the photodiode). Sensing controller 710 can also disable time-of-flight measurement module 724 and control light intensity measurement module 722, which may include an analog-to-digital converter (ADC), to sample and quantize the voltage at capacitor 716 to generate a pixel value representing the intensity of the light transmitted by configurable optical filter 704.

On the other hand, for 3D imaging, sensing controller 710 can control illuminator 702 to project an infra-red pulse onto an object, and control configurable optical filter 704 to transmit light of the infra-red frequency band to pixel cell 706, so that photodiode 712 can detect infra-red photons reflected by the object. Sensing controller 710 can also control variable bias generator 714 to operate photodiode 712 in the avalanche breakdown mode (e.g., by applying a voltage across photodiode 712 that is above the breakdown voltage of the photodiode), such that photodiode 712 can generate an avalanche photocurrent upon receiving a photon reflected by the object. The avalanche photocurrent then causes capacitor 716 to generate a sharp voltage transition. Sensing controller 710 can also disable light intensity measurement module 722, and control time-of-flight measurement module 724 to detect the sharp voltage transition at capacitor 716 to measure a time-of-flight of the infra-red pulse.

Figure 7B:
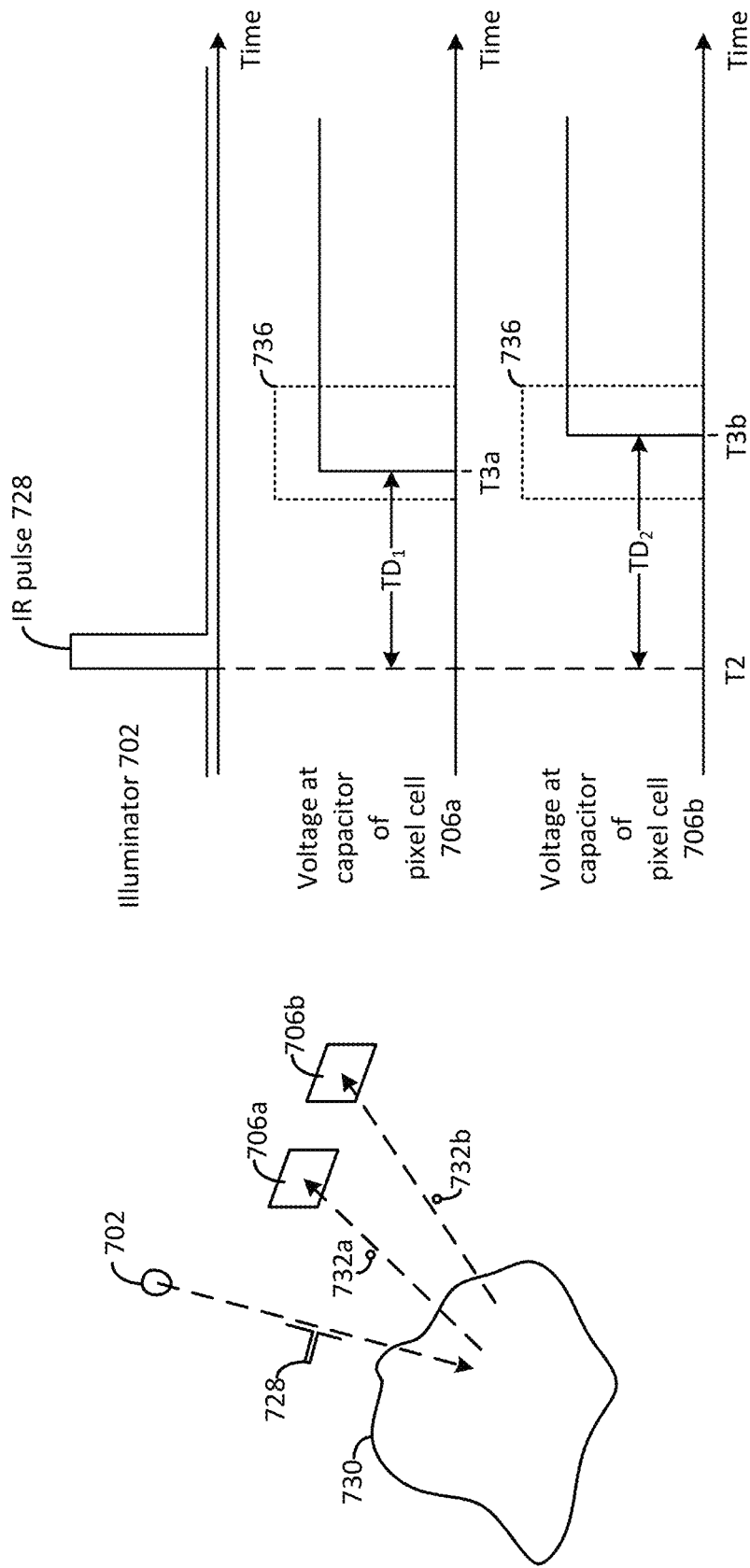

There are different ways by which time-of-flight measurement module 724 can determine a time-of-flight of the infra-red pulse. One way is by performing direct time-of-flight measurement. FIG. 7B illustrates an example of a direct time-of-flight measurement operation that can be performed by image sensor 700. In the example of FIG. 7B, sensing controller 710 can control illuminator 702 to project an infra-red pulse 728 (or a light pulse associated with other frequency bands) towards object 730 at time T2. The photons of the infra-red pulse can be dispersed en route to object 730, and the photons can reach different locations on surface of object 730. The photons can be reflected and move towards image sensor 700 and can be captured by, for example, pixel cells 706a and 706b operating in the Geiger mode. A first photon that enters a pixel cell (e.g., photon 732a for pixel cell 706a, photon 732b for pixel cell 706b, etc.) can trigger an avalanche photocurrent and a sharp voltage transition at the capacitor of that pixel cell (e.g., at time T3a for pixel cell 706a and time T3b for pixel cell 706b). To reduce the likelihood of pixel cells 706a and 706b capturing photons not coming from object 730, sensing controller 710 can set a capture period 736 within which pixel cells 706a and 706b can detect incoming photons. For example, sensing controller 710 can shield the photodiodes in pixel cells 706a and 706b from incoming photons (e.g., by closing shutter 404 of FIG. 4, setting configurable optical filter 704 to reject IR light, etc.) before and after the capture period. The capture period can be set based on, for example, an estimated time-of-flight of the photons, which in turn can be determined based on an estimated distance between image sensor 700 and object 730.

After pixel cells 706a and 706b capture a photon and generate an avalanche photocurrent (at times T3a and T3b), time-of-flight measurement module 724 can determine a time difference $TD_1$ between T2 and T3a (and $TD_2$ between T2 and T3b) to determine the time-of-flight of the photons received at pixel cells 706a and 706b. For example, time-of-flight measurement module 724 may include a counter that can be started at time T2 when the infra-red pulse is projected, and the counter can be stopped at time T3a (for pixel cell 706a) and at time T3b (for pixel cell 706b) when, for example, the voltage at the capacitor reaches a voltage threshold (e.g., voltage threshold $V_{threshold}$ of FIG. 6B). As another example, time-of-flight measurement module 724 may include one or more delay lines used to measure the time-of-flight of the photons. For example, at the same time when the infra-red pulse is projected, an infra-red pulse can also be fed through the one or more delay lines, each of which can be associated with a pre-determined propagation delay. The timing of the outputs of the delay lines can be compared against the voltage at the capacitor by one or more phase detectors. The phase detectors outputs can also be used to estimate time-of-flight. For example, the phase detectors may indicate that reflected infra-red pulse arrives at a time before the output of a first delay line associated with a first propagation delay and after the output of a second delay line associated with a second propagation delay. Based on the indication, it can be estimated that the time-of-flight is between the first propagation delay and the second propagation delay. As yet another example, a time-to-analog converter (TAC), which generate a ramping voltage that increases or decreases with time, can also be used to perform the time-of-flight measurement. For example, the TAC can be controlled to start the ramping voltage at a time point when infra-red pulse is projected, and can be stopped when the ramping voltage crosses the voltage at the capacitor, and the time-of-flight measurement can be performed based on the voltage output (or a digital value representing the voltage output) of the TAC when the ramping stops. In all these examples, the output of time-of-flight measurement module 724 can be used to provide an estimation of, for example, distances between the pixel cells and different points on the surface of object 730.

Figure 7C:
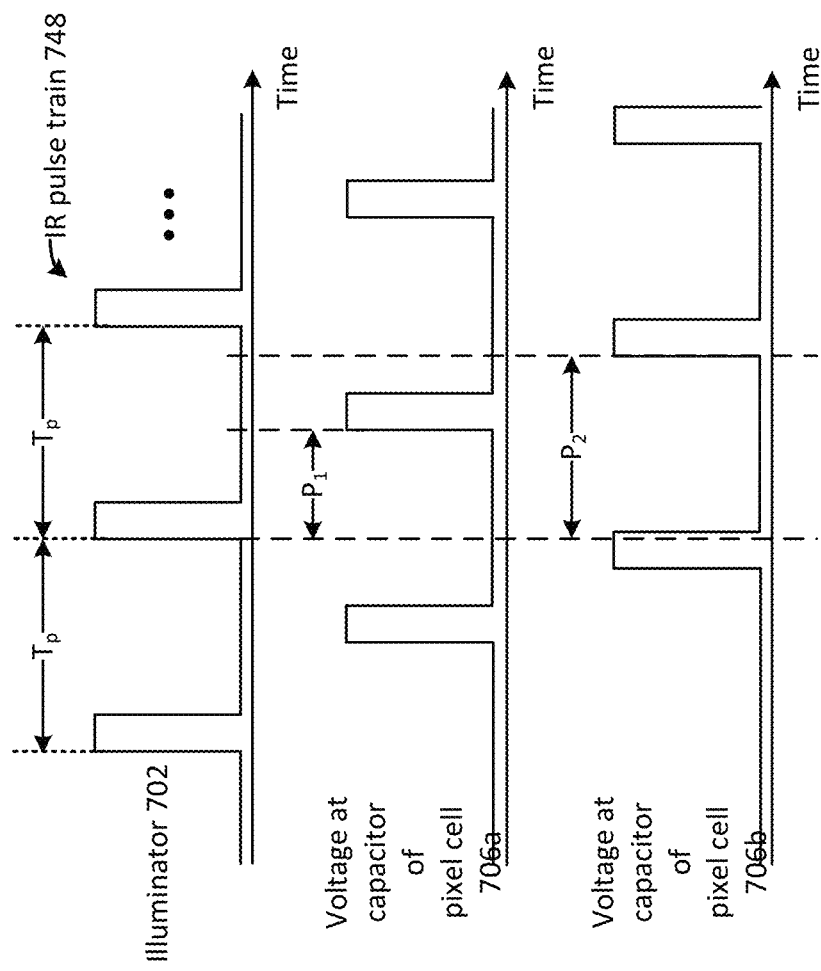
Figure 7C:
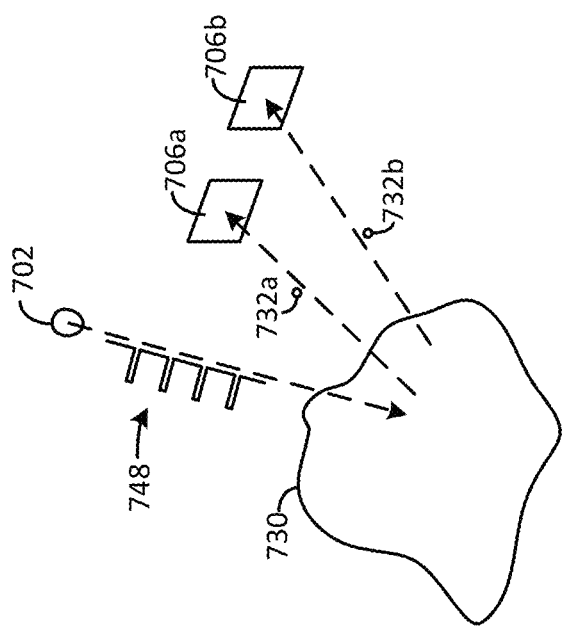

In some examples, time-of-flight measurement module 724 can determine a time-of-flight of the infra-red pulse using indirect time-of-flight measurement. FIG. 7C illustrates an example of an indirect time-of-flight measurement operation that can be performed by image sensor 700. In the example of FIG. 7C, sensing controller 710 can control illuminator 702 to project an infra-red pulse train 748. The pulses can be repeated after each period $T_p$ and can be periodic. The photons of one infra-red pulse can be dispersed en route to object 730, and the photons can reach different locations on surface of object 730. The photons can be reflected and move towards image sensor 700 and can be captured by, for example, pixel cells 706a and 706b operating in the Geiger mode, and trigger avalanche current and sharp voltage transitions at the capacitors of the pixel cells. The capacitors can be reset, and pixel cells 706a and 706b can receive the reflected photons from the next infra-red pulse, which then trigger another avalanche current and another sharp voltage transitions at the capacitors, and a train of voltage pulses can be generated at the capacitors. An indirect time-of-flight measurement can be performed based by determining a phase difference $P_1$ between infra-red pulse train 748 and the voltage pulse train at pixel cell 706a (and $P_2$ between infra-red pulse train 748 and voltage pulse train at pixel cell 706b). The phase differences can also be determined by a counter in time-of-flight measurement module 724. For example, the counter can be started each time a pulse of infra-red pulse train 748 is projected, and the counter can be stopped when, for example, a voltage transition at the capacitor of a pixel cell is detected. The pixel values representing the phase differences can also be used provide an estimation of a distance between the pixel cells and different points on the surface of object 730.

In the examples of FIG. 7B and FIG. 7C, to further reduce the effect of noise photons (e.g., photons that are not generated from illuminator 702 and not reflected off object 730, thermally-generated photons, etc.), time-of-flight measurement module 724 can take into consideration the voltage transitions at a set of pixel cells to determine whether or not to stop the counter for time-difference or phase-difference measurements. In one example, time-of-flight measurement module 724 can detect voltage transitions at a set of pixel cells corresponding to a region of interest (ROI) of object 730 to reduce power consumption. For example, sensing controller 710 can extract, from the 2D imaging data, an outline of object 730 (e.g., based on contrast of light intensity data). Based on the 2D image coordinates of the outline, sensing controller 710 can identify a set of pixel cells that are likely to generate pixel data for object 730, and provide information identifying the set of pixel cells (e.g., identifiers, coordinates of the pixel cells within the pixel array, etc.) to time-of-flight measurement module 724. Time-of-flight measurement module 724 can then monitor for voltage transitions within the identified set of pixel cells (rather than every pixel cell), and can stop the counter for time-difference or phase-difference measurements only when a voltage transition is detected at one of the identified set of pixel cells. In some examples, time-of-flight measurement module 724 can also stop the counter when voltage transitions are detected at a pre-determined number of pixel cells of the identified set or within the pixel cell array within a photon capture period, to adjust the sensitivity of image sensor 700 between 2D sensing and 3D sensing operations. The sensitivity can be adjusted for ambient suppression to avoid the pixel cells generating pixel values based on detecting photons of the ambient light not generated by illuminator 702.

Figure 7D:
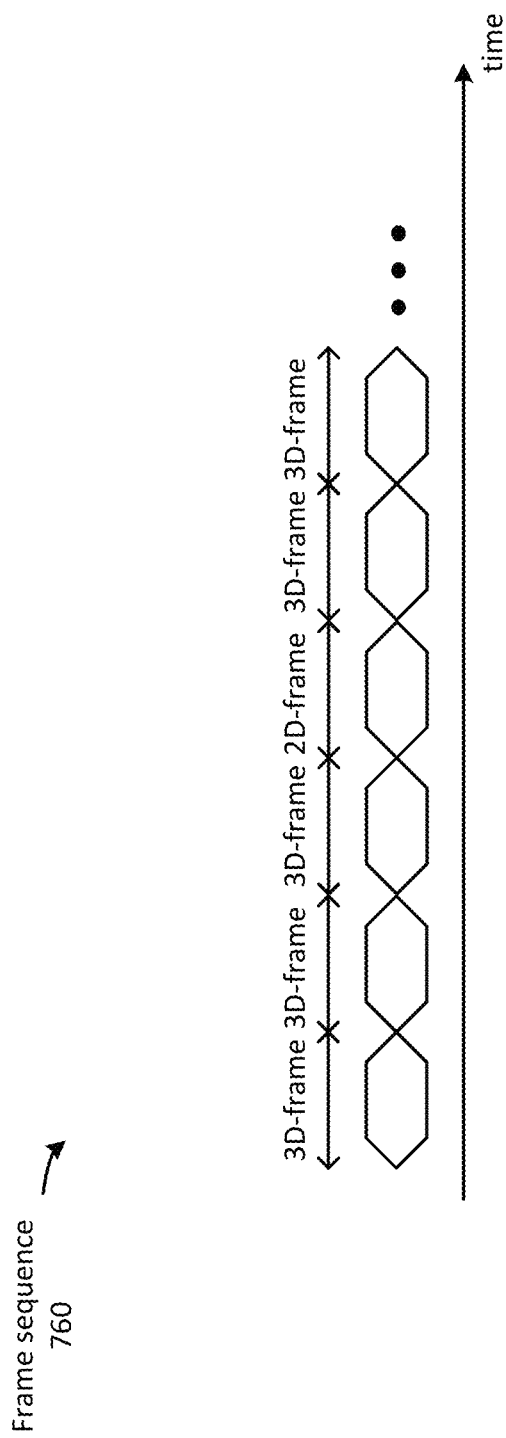

Image sensor 700 can be configured to perform 2D sensing and 3D sensing operations based on a time-multiplexing scheme. The entire pixel cell array can be controlled to perform 2D sensing and 3D sensing operations to generate 2D image frames and 3D image frames at different time. FIG. 7D illustrates an example of a frame sequence 760 including a set of 2D image frames and 3D image frames generated by image sensor 700. In the example of FIG. 7D, frame sequence 760 may include three 3D image frames, followed by a 2D image frame, and then 3D image frames. Each of the 3D image frame and 2D image frame may be captured within, respectively, a 3D exposure period and a 2D exposure period. More 3D image frames may be included to improve the resolution and accuracy of time-of-flight measurement. For example, a larger number of 3D image frames may allow a larger capture period to ensure that photons reflected by an object can be detected by the pixel cell array. A larger capture period may be needed if, for example, the number of photons included in a light pulse generated by illuminator 702 is relatively small (e.g., due to power limit and/or safety requirement), the object to receive the light pulse is relatively far away from the pixel cell array, etc.

Figure 8A:
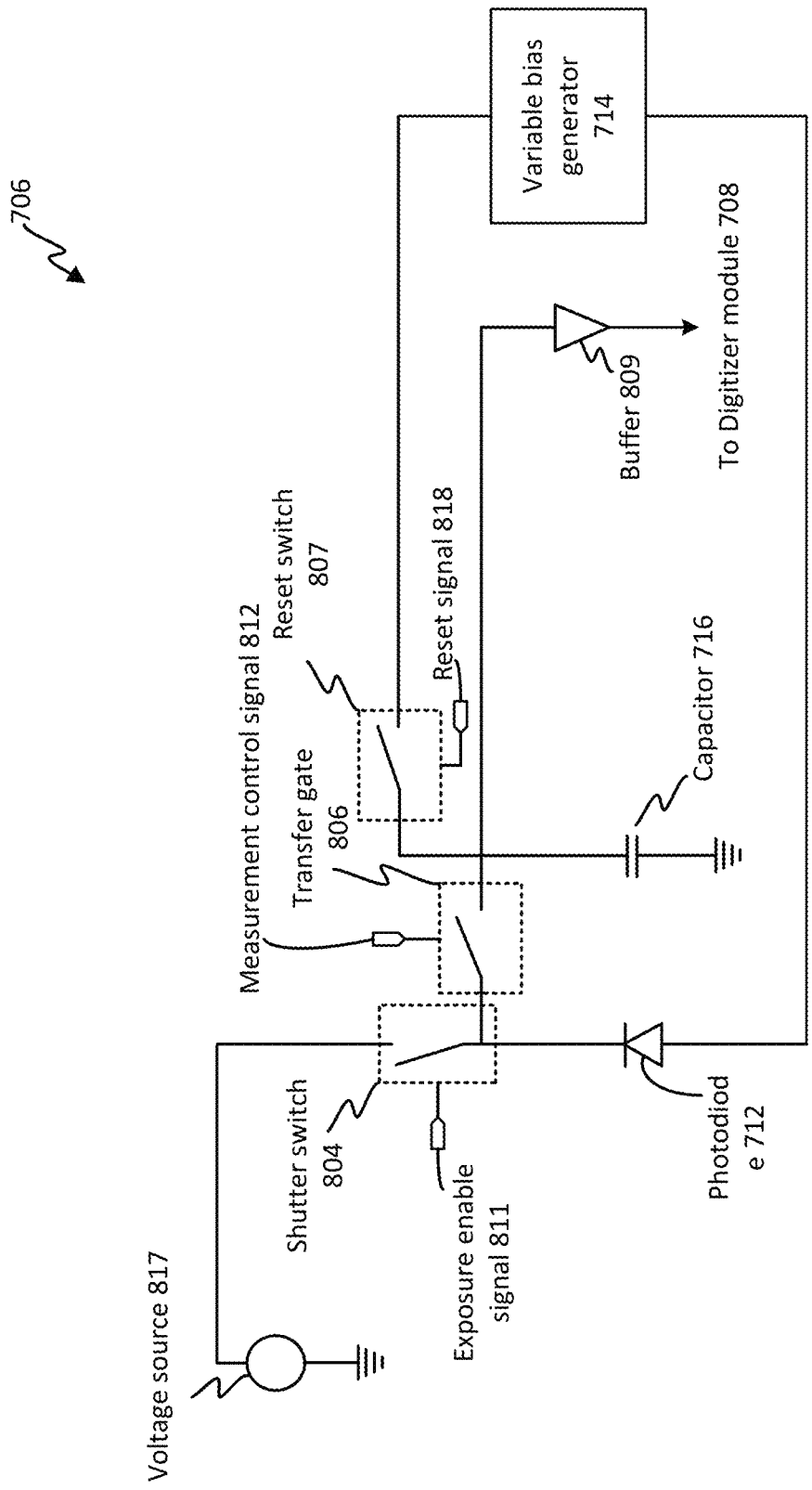
FIG. 8A, FIG. 8B, and FIG. 8C illustrate block diagrams of examples of a pixel cell.
Figure 8B:
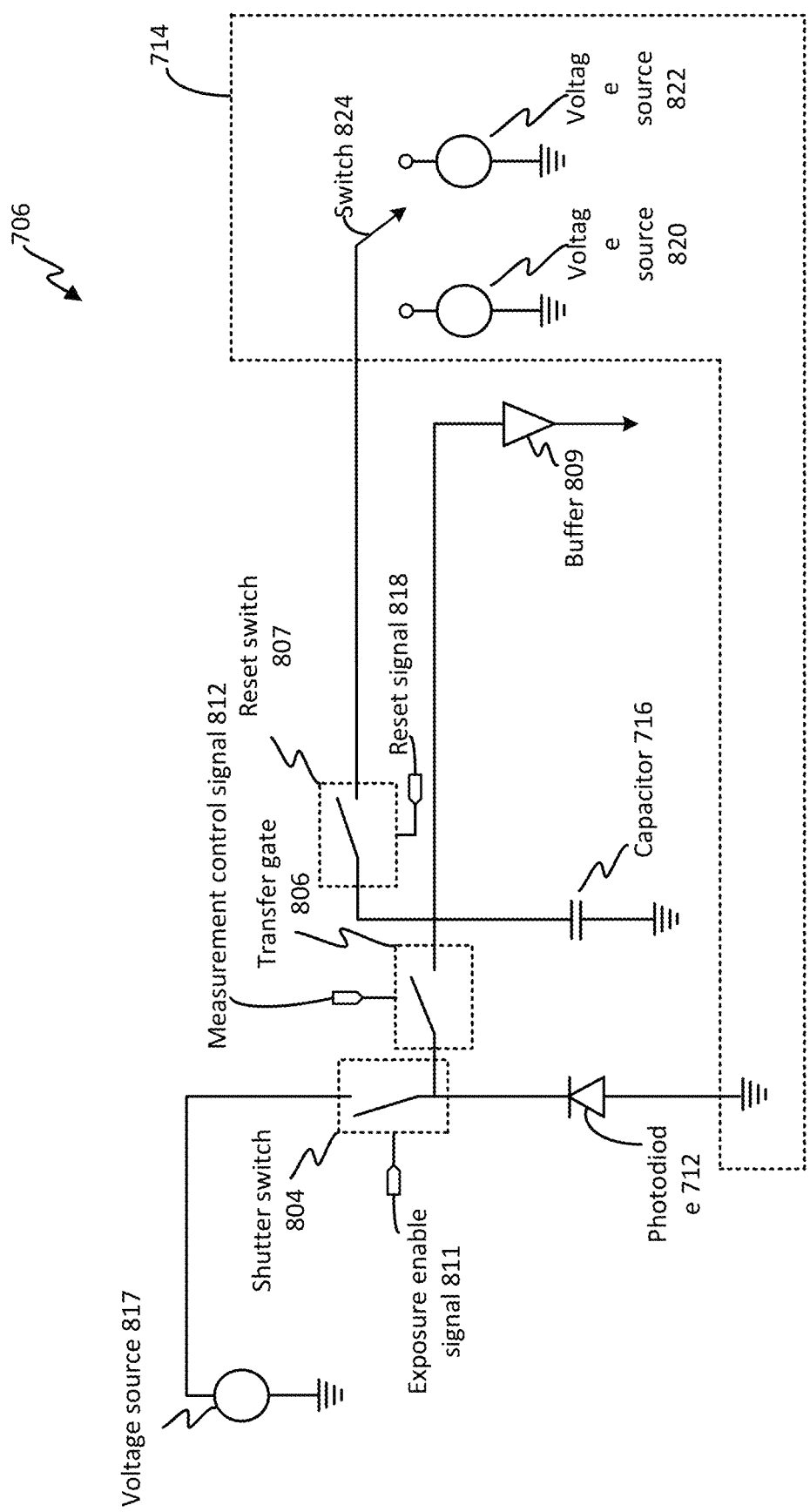
Figure 8C:
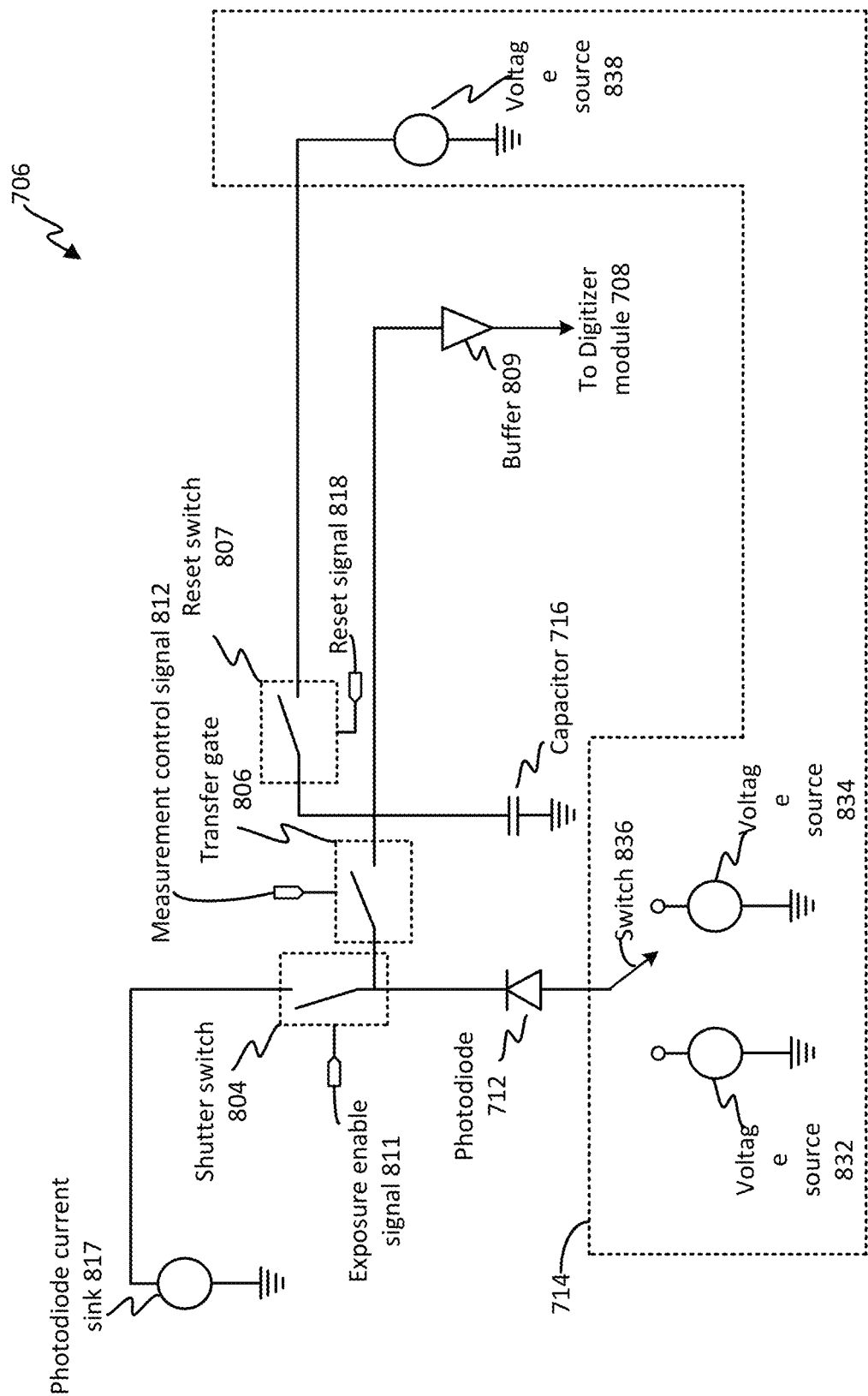

FIG. 8A, FIG. 8B, and FIG. 8C illustrate additional details of example components of pixel cell 706. As shown in FIG. 8A, in addition to photodiode 712, capacitor 716, and variable bias generator 714, pixel cell 706 can further include a shutter switch 804, a transfer gate 806, a reset switch 807, and a buffer 809.

In some embodiments, photodiode 712 may include a P-N diode or a P-I-N diode. Each of shutter switch 804, transfer gate 806, and reset switch 807 can include a transistor. The transistor may include, for example, a metal-oxide-semiconductor field-effect transistor (MOSFET), a bipolar junction transistor (BJT), etc. Shutter switch 804 can act as an electronic shutter gate (in lieu of, or in combination with, mechanical shutter 404 of FIG. 4) to control a 2D exposure period and a 3D exposure period of pixel cell 706. During the exposure period, shutter switch 804 can be disabled (turned off) by exposure enable signal 811, while transfer gate 806 is enabled (turned on) by measurement control signal 812, to allow charges generated by photodiode 712 to move to capacitor 716. At the end of the exposure period, shutter switch 804 can be enabled to steer the charges generated by photodiode 602 into voltage source 817. Moreover, reset switch 807 can also be disabled (turned off) by reset signal 818, which allows measurement capacitor 808 to accumulate the charges and develop a voltage that reflects a quantity of the accumulated charges. The voltage developed at capacitor 716 can be buffered by buffer 809, which can be a source follower, and the buffered voltage can be transmitted to digitizer module 708 to perform the measurement of light intensity of time-of-flight. After the measurement completes, reset switch 807 can be enabled in a reset phase to empty the charges stored at capacitor 716 to a charge sink that can be part of variable bias generator 714, to make capacitor 716 available for the next measurement.

In some examples, switches 804 and 807 can be operated as analog switches with a variable resistance. For example, switches 804 and 807 can be a transistor device (e.g., an NMOS device, a PMOS device, etc.) and a magnitude of a voltage applied to the gates (as exposure enable signal 811, measurement control signal 812, etc.) can be variable to set the on-resistance of both switches. The switches can be used as tunable resistors to control the aforementioned quenching process of photodiode 712 to set the maximum photocurrent Imax to be generated by the photodiode.

FIG. 8B illustrates one example of variable bias generator 714. In the example of FIG. 8B, variable bias generator 714 may include a voltage source 820, a voltage source 822, and a switch 824 to selectively couple one of voltage source 820 or voltage source 822 with reset switch 807. Switch 824 can be controlled by sensing controller 710 to bias photodiode 712 in the reverse bias mode (for a 2D sensing operation) or in the avalanche breakdown mode (for a 3D sensing operation). For example, the anode of photodiode 712 can be coupled with a ground voltage (e.g., at 0 v), whereas voltage source 820 can provide a first positive voltage for biasing photodiode 712 in the reverse bias mode and voltage source 822 can provide a second positive voltage for biasing photodiode 712 in the avalanche breakdown mode. The second voltage can be higher than the first voltage, and the second voltage can also be higher than the breakdown voltage of photodiode 712. The biasing can be performed using capacitor 716. During the reset phase, reset switch 807 can be enabled to charge capacitor 716 to a first voltage set by voltage source 820 (in a 2D sensing operation) or to a second voltage set by voltage source 822 (in a 3D sensing operation). When the exposure period starts, transfer gate 806 can be enabled, which can couple the cathode of photodiode 712 with capacitor 716 to set the voltage of the cathode at one of the first positive voltage or the second positive voltage. With the anode of photodiode 712 being set to ground voltage (e.g., zero volts), the photodiode 712 can be biased in the reverse bias mode (where the voltage difference across the photodiode equals to the first voltage) or in the avalanche breakdown mode (where the voltage difference across the photodiode equals to the second voltage).

FIG. 8C illustrates another example of viable bias generator 714. In the example of FIG. 8C, variable bias generator 714 may include a voltage source 832, a voltage source 834, and a switch 836 to selectively couple one of voltage source 832 or voltage source 834 with the anode of photodiode 712. Variable bias generator 714 further includes a voltage source 838 coupled with reset switch 807. Switch 836 can also be controlled by sensing controller 710 to bias photodiode 712 in the reverse bias mode (for a 2D sensing operation) or in the avalanche breakdown mode (for a 3D sensing operation). Voltage source 838 can provide a third positive voltage, whereas voltage source 832 can provide a ground voltage and voltage source 834 can provide a negative voltage. When operating in the 2D sensing mode, voltage source 832 can be coupled with the anode of photodiode 712, and the voltage difference across the photodiode (the difference between the third positive voltage and the ground voltage) can be configured to operate photodiode 712 in the reverse bias mode. When operating in the 3D sensing mode, voltage source 834 can be coupled with the anode of photodiode 712, and the voltage difference across the photodiode (the difference between the third positive voltage and the negative voltage) can be larger than the breakdown voltage to operate photodiode 712 in the avalanche breakdown mode. Compared with the example of FIG. 8A, the third voltage provided by voltage source 838 can be considerably lower than the second voltage provided by voltage source 822. Such arrangements allow shutter switch 804, transfer gate 806, reset switch 807, and buffer 809 to be implemented with semiconductor processes which are optimized for high speed, low power, and low noise operations, but typically have low tolerance for voltage stress. This not only facilitates device integration but also speeds up the operations of pixel cell 706 as well as the imaging operations.

Although FIGS. 8A-8C illustrate that variable bias generator 714 is part of pixel cell 706, it is understood that variable bias generator 714 can be external to pixel cell 706. For example, variable bias generator 714 and that pixel cell array (which includes pixel cell 706) can be on two different integrated circuit (IC) chips, and each pixel cell of the pixel cell array can share a single variable bias generator 714 to obtain, for example, a negative voltage for the anode of photodiode 712 as in the example of FIG. 8C.

Figure 9:
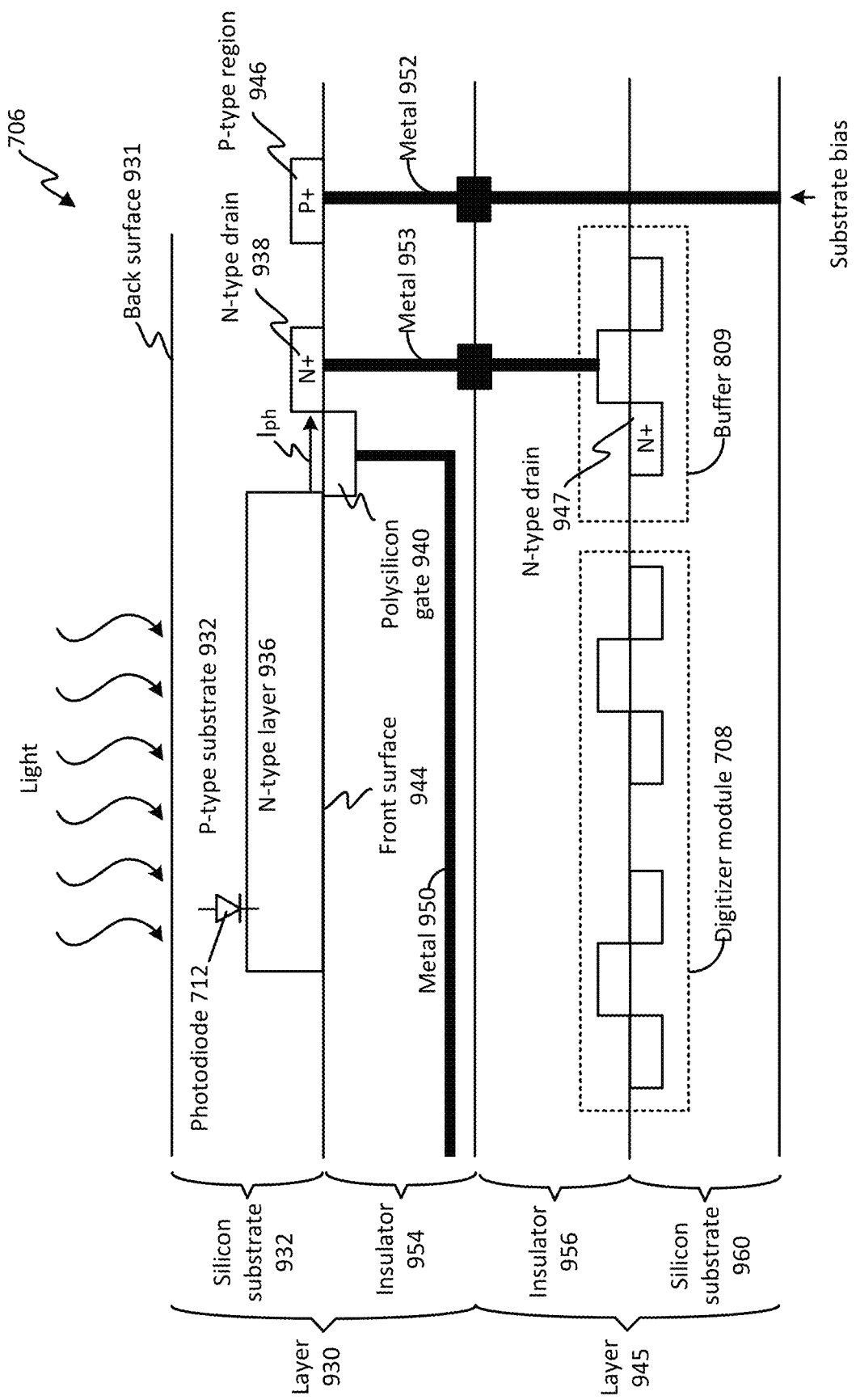
FIG. 9 illustrates an example structure of a pixel cell.

FIG. 9 illustrates an examples of a device structure of pixel cell 706. In the example of FIG. 9, pixel cell 706 includes two semiconductor layers 930 and 945. Semiconductor layer 930 may implement photodiode 712, shutter switch 804, transfer gate 806, and reset switch 807, whereas semiconductor layer 945 may implement buffer 809. In some examples, semiconductor layer 945 may also implement digitizer module 708 and/or variable bias generator 714. Referring to FIG. 9, Semiconductor layer 930 may include a P-type silicon substrate 932 and an N-type layer 936 to form photodiode 712. N-type layer 936 can be an N+(with a high doping concentration) layer, an N-well, etc. P-type silicon substrate 932 may include a back surface 931 for receiving light. P-type silicon substrate 932 may form the anode of photodiode 712, whereas N-well 936 may form the cathode of photodiode 712. In some examples, semiconductor layer 930 may further include a P+ pinning layer (not shown in FIG. 9) such that photodiode 712 can be a pinned photodiode. In some examples (not shown in FIG. 9), semiconductor layer 930 may include a P-type layer (or a P-well) surrounded by N-type layer 936 to form the anode of photodiode 712.

Silicon substrate 932 further includes N-type drain 938 which can be configured as capacitor 716. Silicon substrate 932 further includes a polysilicon gate 940 on a front surface 944 of silicon substrate 932. Polysilicon gate 940 may form transfer gate 806. Silicon substrate 932 further includes a P-type region 946 for biasing P-type substrate 932 (and anode of photodiode 712). On the other hand, semiconductor layer 945 includes silicon substrate 960 to implement buffer 809, digitizer module 708 and variable bias generator 714. Silicon substrates 932 and 960 can be separated by insulator layers 954 and 956.

Semiconductor layer 930 further includes a set of metal lines including, for example, metals 950, 952, and 953. Metal 950 may be for transmitting a signal (e.g., measurement control signal 812) to polysilicon gate 940, whereas metal 953 may be for transmitting the voltage at N-type drain 938 (capacitor 716) to buffer 609 in semiconductor layer 945. The output of buffer 609 can be an N-type drain 947, which can be coupled with other devices (e.g., digitizer module 708) in semiconductor layer 945. Metal 952 may be for transmitting a bias voltage from an external circuit or from devices of semiconductor layer 945 implementing variable bias generator 714 to set the bias of P-type substrate 932 (and anode of photodiode 712). The metal lines can be positioned within insulator layers 954 and 956, which can insulate the metal lines from the active regions within silicon substrates 932 and 960.

In some embodiments, as shown in FIG. 9, semiconductor layers 930 and 945 can be stacked to form a stack structure, with photodiode 712 overlapping at least partially with the devices of digitizer module 708, to maximize the available area for the pixel cells, which can result in substantial improvement in the resolutions of image sensor 700. Besides increasing available area for the photodiodes, the stack structure also enables minimizing routing the photodiode and the processing circuitries (e.g., digitizer module 708). The minimized routing can also reduce capacitive coupling and the noise charges. All these can improve the performance of image sensor 700.

Figure 10:
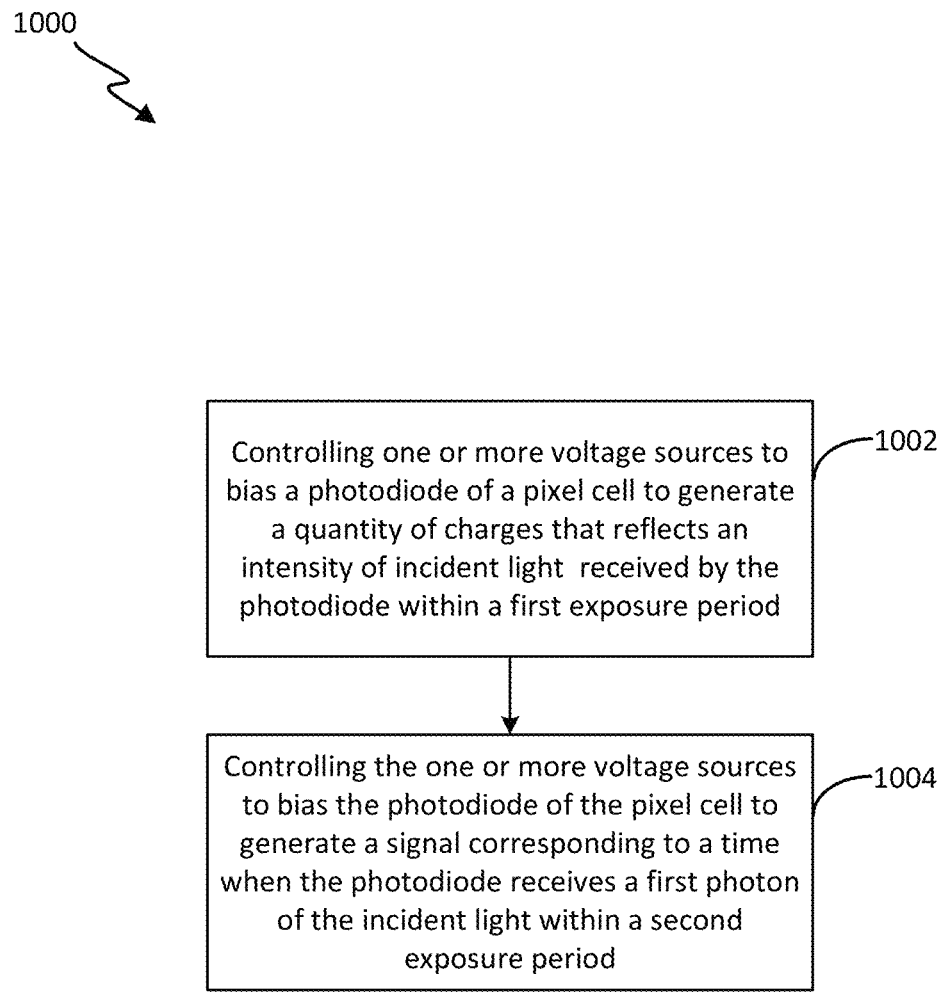
FIG. 10 illustrates an example of a flowchart for performing imaging.

FIG. 10 illustrates an embodiment of a flowchart of a process 1000 for performing imaging of a scene. Process 1000 can be performed by, for example, control circuitries 510 in conjunction with various components of image sensor 700. Process 1000 begins in step 1002, where one or more voltage sources (e.g., variable bias generator 714) can be controlled to bias a photodiode of a pixel cell (e.g., photodiode 712 of pixel cell 706) to generate a quantity of charges that reflects an intensity of incident light received by the photodiode within an first exposure period. As part of step 1002, the photodiode can be biased to operate under a reverse bias mode where the voltage difference across the cathode and the anode of the photodiode is below the breakdown voltage of the photodiode. Sensing controller 710 can also disable illuminator 702 and control configurable optical filter 704 to transmit a certain band of visible light (e.g., red, green, or blue colors) to the photodiode. As part of step 1002, sensing controller 710 can control light intensity measurement module 722, which may include an analog-to-digital converter (ADC), to sample and quantize the voltage at capacitor 716 to generate a pixel value representing the intensity of the light transmitted by configurable optical filter 704.

In step 1004, the one or more voltage sources (e.g., variable bias generator 714) can be controlled to bias the photodiode of the pixel cell to generate a signal corresponding to a time when the photodiode receives a first photon of the incident light within a second exposure period. As part of step 1004, the photodiode can be biased to operate under an avalanche breakdown mode where the voltage difference across the cathode and the anode of the photodiode is above the breakdown voltage of the photodiode. Sensing controller 710 can control illuminator 702 to project an infra-red pulse onto an object, and control configurable optical filter 704 to transmit light of the infra-red frequency band to pixel cell 706, so that photodiode 712 can detect infra-red photons reflected by the object. As part of step 1004, sensing controller 710 can control time-of-flight measurement module 724, which may include a time-to-digital converter (TDC) such as a counter, to determine a time difference or a phase difference between when the infra-red pulse is projected and when a first photon of the reflected pulse is detected at the pixel cell, and to digitize the time/phase difference to form a pixel value representing a distance between the pixel cell and the object.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. An apparatus comprising:
a dual-mode pixel cell operable in a linear mode and in an avalanche mode at different times, the pixel cell including a photodiode to receive incident light; and
one or more voltage sources coupled with the photodiode, the one or more voltage sources being configurable,
wherein in the linear mode, the one or more voltage sources are configured to bias the photodiode to generate a quantity of charges that reflects a quantity of photons of the incident light received by the photodiode within a first exposure period; and
wherein in the avalanche mode, the one or more voltage sources are configured to bias the photodiode to generate a signal corresponding to a time when an avalanche current is generated at the photodiode upon the photodiode receiving a first photon of the incident light within a second exposure period for a time-of-flight measurement.

2. The apparatus of claim 1, wherein in the linear mode, the one or more voltage sources are configured to bias the photodiode to generate a current of which a magnitude is proportional to an intensity of the incident light.

3. The apparatus of claim 1, further comprising:
an analog-to-digital converter (ADC) configured to generate a first digital representation of the quantity of charges generated in the first exposure period; and
a time-to-digital converter (TDC) configured to generate a second digital representation of the time-of-flight measurement,
wherein the photodiode is implemented in a first semiconductor layer;
wherein at least one of the ADC or the TDC is implemented in a second semiconductor layer; and
wherein the first semiconductor layer and the second semiconductor layer form a stack structure.

4. The apparatus of claim 1, wherein the one or more voltage sources are connected to a semiconductor substrate including the photodiode;
wherein the one or more voltage sources are configured to set the semiconductor substrate at a first bias voltage and at a second bias voltage in, respectively, the linear mode and the avalanche mode; and
wherein the photodiode is biased based on the first bias voltage or the second bias voltage of the semiconductor substrate.

5. The apparatus of claim 1, wherein the one or more voltage sources are configured to bias the photodiode via at least one of: a capacitor of the apparatus, or a semiconductor substrate that includes the photodiode.

6. The apparatus of claim 5, wherein the capacitor is connected to the one or more voltage sources before an exposure period starts to store a first bias voltage in the linear mode and to store a second bias voltage in the avalanche mode; and
wherein the capacitor is connected to the photodiode after the exposure periods to bias the photodiode based on the first bias voltage or the second bias voltage.

7. The apparatus of claim 6, wherein the capacitor is further configured to store the charges generated by the photodiode after the exposure period starts.

8. The apparatus of claim 1, further comprising a controller coupled with the pixel cell;
wherein the controller is configured to:
operate the pixel cell in the linear mode at a first time to generate first data representing an intensity of light reflected by an object; and
operate the pixel cell in the avalanche mode at a second time to generate second data representing a distance between the apparatus and the object.

9. The apparatus of claim 8, further comprising:
a plurality of pixel cells, each of the plurality of pixel cells being operable in the linear mode or in the avalanche mode; and
a time-to-digital converter configured to generate a digital representation of a time-of-flight measurement for a pre-determined subset of the plurality of pixel cells being operated in the avalanche mode.

10. The apparatus of claim 9, wherein the controller is configured to:
determine a number of pixel cells of which the photodiode generates the signal; and
responsive to determining that the number of pixel cells exceeds a threshold, control the time-to-digital converter to generate the digital representation of the time-of-flight measurement.

11. The apparatus of claim 9, wherein the pre-determined subset of the plurality of pixel cells corresponds to a region-of-interest determined from an image frame; and
wherein the image frame is generated based on output data of the plurality of pixel cells being operated in the linear mode.

12. The apparatus of claim 8, further comprising an illuminator;
wherein the controller is configured to control the illuminator to project a pulse of photons including the first photon in the avalanche mode and to disable the illuminator in the linear mode; and
wherein in the avalanche mode, the pixel cell is operated to receive the first photon reflected by the object.

13. The apparatus of claim 12, wherein:
the controller is configured to control the illuminator to project a first train of pulses of photons in the avalanche mode;
the photodiode is configured to generate a second train of pulses of signals based on detecting one or more photons of the first train of pulses reflected by the object; and
the controller is configured to determine a phase difference between the first train of pulses and the second train of pulses for the time-of-flight measurement.

14. The apparatus of claim 12, further comprising:
a capacitor configured to store charges generated by the photodiode;
a reset switch configured to:
before the first exposure period, set a voltage at the capacitor based on a first bias voltage supplied by the one or more voltage sources, and
before the second exposure period, set the voltage at the capacitor based on a second bias voltage supplied by the one or more voltage sources; and
a transfer gate configured to electrically couple the capacitor to a cathode of the photodiode during the first exposure period and during the second exposure period, such that the cathode of the photodiode is biased at the first bias voltage when the linear mode begins, and the cathode of the photodiode is biased at the second bias voltage the avalanche mode begins.

15. The apparatus of claim 12, wherein the controller is configured to:

determine a third time when the illuminator projects the pulse of photons;

determine a fourth time when the first photon reflected by the object is received by the photodiode; and determine a difference between the third time and the fourth time for the time-of-flight measurement.

16. The apparatus of claim 15, wherein the controller is configured to:

determine a timing window for detecting the first photon based on the third time; and determine a first photon received by the photodiode within the timing window as the first photon reflected by the object.

17. The apparatus of claim 12, wherein the one or more voltage sources are configured to:

in the linear mode, bias a cathode of the photodiode at a first voltage and bias an anode of the photodiode at a second voltage; and in the avalanche mode, bias the cathode of the photodiode at a third voltage and bias the anode of the photodiode at a fourth voltage, wherein a first difference between the first voltage and the second voltage is smaller than a second difference between the third voltage and the fourth voltage; and wherein the second difference is larger than a breakdown voltage of the photodiode.

18. The apparatus of claim 17, wherein the third voltage is higher than the first voltage.

19. The apparatus of claim 17, wherein the fourth voltage is lower than the second voltage.

20. The apparatus of claim 19, wherein the fourth voltage is a negative voltage.

21. The apparatus of claim 20, wherein the one or more voltage sources comprises a first voltage source configured to generate the second voltage in the linear mode and the fourth voltage in the avalanche mode to bias the anode of the photodiode; and wherein in the first voltage source is external to the pixel cell.

22. A method comprising:

at a first exposure period, controlling one or more voltage sources to bias a photodiode of a pixel cell to operate in a linear mode, in which the photodiode generates a quantity of charges that reflects an intensity of incident light received by the photodiode within the first exposure period; and at a second exposure period, controlling the one or more voltage sources to bias the photodiode of the pixel cell to operate in an avalanche mode, in which the photodiode generates a signal corresponding to a time when an avalanche current is generated at the photodiode upon the photodiode receiving a first photon of the incident light within the second exposure period.

* * * * *